(12) United States Patent
Montero et al.

(10) Patent No.: US 11,757,138 B2
(45) Date of Patent: Sep. 12, 2023

(54) SYSTEM AND METHOD OF OPERATING MOBILE INFORMATION HANDLING SYSTEMS WITH RECHARGEABLE BATTERIES

(71) Applicant: Dell Products L.P., Round Rock, TX (US)

(72) Inventors: Adolfo Sandor Montero, Pflugerville, TX (US); Pei Mng Lin, Zhugi Township (TW); Chia Liang Lin, Taoyuan (TW); Shao Szu Ho, New Taipei (TW); Jui-Chin Fang, Wenshan Dist (TW)

(73) Assignee: Dell Products L.P., Round Rock, TX (US)

( * ) Notice: Subject to any disclaimer, the term of this patent is extended or adjusted under 35 U.S.C. 154(b) by 222 days.

(21) Appl. No.: 17/234,318

(22) Filed: Apr. 19, 2021

(65) Prior Publication Data

US 2022/0336869 A1    Oct. 20, 2022

(51) Int. Cl.
*G01R 31/392*  (2019.01)
*H01M 10/42*   (2006.01)
*H01M 10/48*   (2006.01)
*G01R 31/3835* (2019.01)

(52) U.S. Cl.
CPC .... *H01M 10/4257* (2013.01); *G01R 31/3835* (2019.01); *G01R 31/392* (2019.01); *H01M 10/48* (2013.01); *H01M 2010/4271* (2013.01); *H01M 2220/30* (2013.01)

(58) Field of Classification Search
CPC ............ H01M 10/4257; H01M 10/48; H01M 2010/4271; H01M 2220/30; G01R 31/392; G01R 31/3835
USPC ........................................................ 320/134
See application file for complete search history.

(56) References Cited

U.S. PATENT DOCUMENTS

2020/0052519 A1*  2/2020  Thompson ................ H02J 7/02
2021/0215766 A1*  7/2021  Ji ......................... G01R 31/367

* cited by examiner

*Primary Examiner* — Nathaniel R Pelton
(74) *Attorney, Agent, or Firm* — McDermott Will & Emery LLP

(57) ABSTRACT

In one or more embodiments, one or more systems, one or more methods, and/or one or more processes may determine multiple voltage values associated with a rechargeable battery over a period of time; store the multiple voltage values with respect to multiple clock values over the period of time; determine a voltage drop rate from the multiple voltage values and the multiple clock values; determine a threshold voltage value associated with a predicted energy capacity of the rechargeable battery for a mobile information handling system (IHS) to perform a power state transition; determine a voltage value associated with the rechargeable battery; determine that the voltage value has reached the threshold voltage value; provide a notification to an operating system executed by the mobile IHS; store data from a volatile memory medium to a non-volatile memory medium; and transition the mobile IHS from an operational state to a power conservation state.

20 Claims, 10 Drawing Sheets

SYSTEM AND METHOD OF OPERATING MOBILE INFORMATION HANDLING SYSTEMS WITH RECHARGEABLE BATTERIES

BACKGROUND

Field of the Disclosure

This disclosure relates generally to information handling systems and more particularly to operating mobile information handling systems with rechargeable batteries.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one or more embodiments, one or more systems, one or more methods, and/or one or more processes may determine multiple voltage values associated with a rechargeable battery of a mobile information handling system over a period of time; may store the multiple voltage values with respect to multiple clock values over the period of time; may determine a voltage drop rate from the multiple voltage values and the multiple clock values; may determine a threshold voltage value associated with a predicted energy capacity of the rechargeable battery for the mobile information handling system to perform a power state transition; may determine a voltage value associated with the rechargeable battery; may determine that the voltage value has reached the threshold voltage value; may provide a notification to perform the power state transition to an operating system executed by the mobile information handling system; and in response to the notification: may store, by the operating system, data from a volatile memory medium of the mobile information handling system to a non-volatile memory medium; and may transition, by the operating system, the mobile information handling system from an operational state to a power conservation state.

In one or more embodiments, the one or more systems, the one or more methods, and/or the one or more processes may further: may determine that the mobile information handling system is receiving power from an external power supply; and in response to determining that the mobile information handling system is receiving power from the external power supply: may transition the mobile information handling system from the power conservation state to the operational state; and may restore the data from the non-volatile memory medium to the volatile memory medium. In one or more embodiments, the one or more systems, the one or more methods, and/or the one or more processes may further determine the multiple clock values via a real time clock.

In one or more embodiments, the one or more systems, the one or more methods, and/or the one or more processes may further determine a temperature value associated with the rechargeable battery. For example, determining the voltage drop rate may be based at least on the temperature value associated with the rechargeable battery. In one or more embodiments, the one or more systems, the one or more methods, and/or the one or more processes may further determine a number of charge cycles associated with the rechargeable battery. For example, determining the voltage drop rate may be based at least on the number of charge cycles associated with the rechargeable battery.

In one or more embodiments, the one or more systems, the one or more methods, and/or the one or more processes may further determine that the mobile information handling system is receiving power from an external power supply. For example, in response to determining that the mobile information handling system is receiving power from the external power supply, the one or more systems, the one or more methods, and/or the one or more processes may further: transition the mobile information handling system from the power conservation state to the operational state and restore the data from the non-volatile memory medium to the volatile memory medium.

In one or more embodiments, the rechargeable battery may include a battery management unit. For example, determining the voltage drop rate from the multiple voltage values and the multiple values may include determining, by the battery management unit, the voltage drop rate from the multiple voltage values and the multiple clock values. In one or more embodiments, storing the data from the volatile memory medium to the non-volatile memory medium may include storing the data as a file that is stored via the non-volatile memory medium.

In one or more embodiments, a battery management unit may be configured to: determine multiple voltage values associated with a rechargeable battery of a mobile information handling system over a period of time; store the multiple voltage values with respect to multiple clock values over the period of time; determine a voltage drop rate from the multiple voltage values and the multiple clock values; determine a threshold voltage value associated with a predicted energy capacity of the rechargeable battery for the mobile information handling system to perform a power state transition; determine a voltage value associated with the rechargeable battery; determine that the voltage value has reached the threshold voltage value; and provide a notification to transition the mobile information handling system from an operational state to a power conservation state.

In one or more embodiments, to provide the notification to transition the mobile information handling system from the operational state to the power conservation state, the battery management unit may be further configured to provide the notification to an embedded controller of the mobile information handling system. In one or more embodiments, the battery management unit may be further configured to determine the multiple clock values via a real time clock of the mobile information handling system.

In one or more embodiments, the battery management unit may be further configured to determine a temperature value associated with the rechargeable battery. For example, to determine the voltage drop rate, the battery management unit may be further configured to determine the voltage drop rate based at least on the temperature value associated with the rechargeable battery. In one or more embodiments, the battery management unit may be further configured to determine a number of charge cycles associated with the rechargeable battery. For example, to determine the voltage drop rate, the battery management unit may be further configured to determine the voltage drop rate based at least on the number of charge cycles associated with the rechargeable battery.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

Figure 1A:
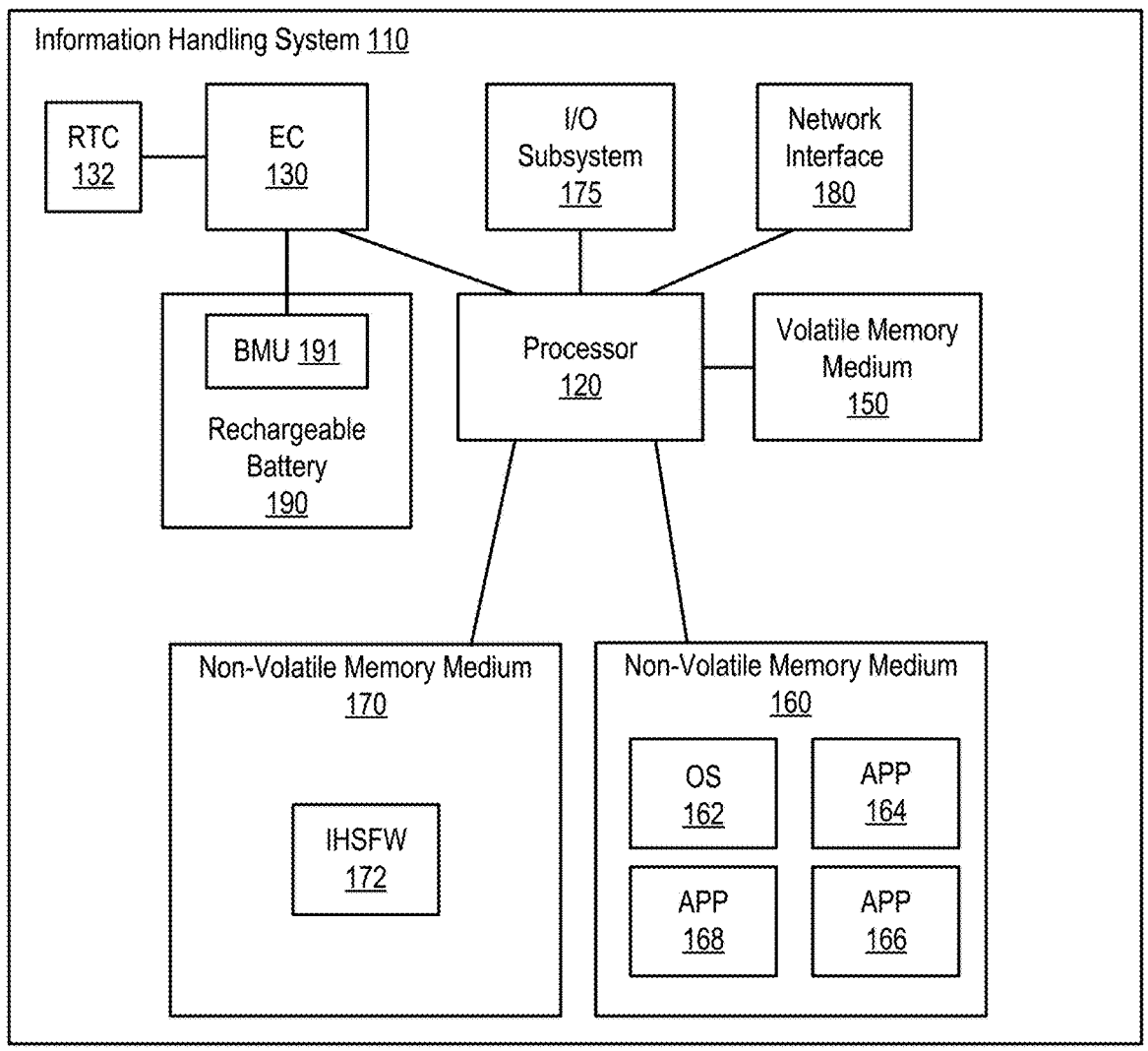
FIG. 1A illustrates an example of an information handling system, according to one or more embodiments.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

In one or more embodiments, a rechargeable battery may include one or more rechargeable cells. In one or more embodiments, over discharging a rechargeable battery may damage or ruin the rechargeable battery. For example, one or more gases may build up within the rechargeable battery when the rechargeable battery is over discharged. For instance, the one or more gases that may build up within the rechargeable battery may deform a housing of the rechargeable battery. In one or more embodiments, the rechargeable battery may include lithium polymer cells. For example, over discharging a lithium polymer cell may cause "delithiation" of an anode of the cell, which may cause decomposition of a solid electrolyte interphase (SEI) layer. For instance, as the SEI breaks down, one or more gases, such as one or more of carbon monoxide (CO) and carbon dioxide ($CO_2$) may deform a housing of the cell, which may damage other cells of a batter and/or damage and/or deform a housing of the rechargeable battery. As an example, a deformation of the housing of the cell may include swelling of the housing of the cell. For instance, swelling of the housing of the cell may damage other cells of a batter and/or swell and/or damage a housing of the rechargeable battery.

In one or more embodiments, a voltage value of a cell may be determined. For example, if the voltage value of the cell falls below a threshold voltage value, an information handling system may be transitioned to a power conservation state to prevent the cell from damaging a rechargeable battery of the information handling system and/or to prevent the cell from being damaged. In one or more embodiments, the threshold voltage value may be set in firmware. For example, the threshold voltage value may be set in source code of the firmware and compiled into the firmware as a static threshold voltage value (e.g., a "critical low" voltage value). In one or more embodiments, different cells may be associated with different grades. For example, some cells associated with a first grade may be better than other cells associated with a second grade.

In one or more embodiments, the static threshold voltage value may be based at least on an average cell grade, an end-of-life charge cycle span, and an average temperature of a cell, among others. In one example, the static threshold voltage value may reduce a usage time that a user may utilize an information handling system on rechargeable battery power when conservative attribute values are utilized to determine the static threshold voltage value. In another example, the static threshold voltage value may reduce a lifespan of a cell (and its rechargeable battery) when aggressive attribute values are utilized to determine the static threshold voltage value.

In one or more embodiments, after a rechargeable battery exceeds a shelf life limit and discharges below that an absolute minimum voltage value, permanent damage to cells occurs of the rechargeable battery may occur at a chemical level and a battery management unit may set a permanent failure flag to avoid safety issues. For example, the battery management unit may set a permanent failure flag to avoid safety issues if the rechargeable battery were to be put back into service (e.g., allowing additional charge/discharge cycles to occur).

In one or more embodiments, a variable threshold voltage value may be utilized. For example, if a voltage value of the cell falls below the variable threshold voltage value, an information handling system may be transitioned to a power conservation state to prevent the cell from damaging a rechargeable battery of the information handling system and/or to prevent the cell from being damaged. For instance, the variable threshold voltage value may be utilized as a "critical low" voltage value.

In one or more embodiments, the variable threshold voltage value may be utilized in accounting for different grades between or among different cells, accounting for changes in temperature of a cell, and/or accounting for a number of charge cycles associated with the cell, among others. For example, the variable threshold voltage value may be determined based at least on a grade of a cell, a temperature value associated with the cell, and a number of charge cycles associated with the cell, among others.

In one or more embodiments, a battery management unit may determine power entering a cell and/or power exiting the cell. For example, the battery management unit may track power consumption levels associated with an information handling system. For instance, power consumption levels may differ from one information handling system to another information handling system based at least on applications installed on an information handling system and workloads process by the information handling system. Other power consumption attributes may also affect the information handling system as well, for example. For instance, the other power consumption attributes that also affect the information handling system may include a brightness setting of a display of the information handling system, one or more peripheral devices coupled to the information handling system, etc.

In one or more embodiments, electrical current from the rechargeable battery may be measured each second. For example, electrical current from the rechargeable battery may be measured each second for large rechargeable battery loads such as an operating system is up and running. In one or more embodiments, for small rechargeable battery loads, electrical current from the rechargeable battery may be measured over multiple days. For example, for small rechargeable battery loads, electrical current from the rechargeable battery may be measured over multiple days to achieve accurate readings after being an average value can be determined.

In one or more embodiments, when a mobile information handling system is effectively off. For example, the information handling system may be in an Advanced Configuration and Power Interface (ACPI) state of "G3". In one or more embodiments, an information handling system may be associated with multiple ACPI power states. In one example, when the information handling system is associated with an ACPI power state of "G0", the information handling system may be in a working state, in which the information handling system is on. In a second example, when the information handling system is associated with an ACPI power state of "G1", the information handling system may be in sleeping state, in which the information handling system appears to be off. In a third example, when the information handling system is associated with an ACPI power state of "G2", the information handling system may be in a soft off state, which requires an operating system to be rebooted when leaving the state of "G2" for a higher level of information handling system readiness. In another example, when the information handling system is associated with an ACPI power state of "G3", the information handling system may be in a mechanical off state.

In one or more embodiments, when a mobile information handling system is in the ACPI power state of "G3", a battery management unit of a rechargeable battery of the information handling system may "wake up" periodically to monitor the rechargeable battery. In one example, the battery management unit monitoring the rechargeable battery may include determining changes in energy storage capacity over a period of time to estimate how long a charge of the rechargeable battery may last in storage mode before reaching a permanent failure low voltage threshold (e.g., 1.5 volts per cell). For instance, the period of time may include multiple days. In a second example, the battery management unit monitoring the rechargeable battery may include determining an open circuit voltage value associated with the rechargeable battery. In another example, the battery management unit monitoring the rechargeable battery may include determining current loading (e.g., C-rate) of the rechargeable battery.

In one or more embodiments, the battery management unit may be configured with information associated with a specification for a shelf life associated with the rechargeable battery. For example, the shelf life associated with the rechargeable battery may be in terms of a number of days a charge of the rechargeable battery must last in a specific mode. In one or more embodiments, the battery management unit may determine a rate of discharge while the mobile information handling system operates in various ACPI power states. For example, the battery management unit may determine a variable threshold voltage value (e.g., a "critical low" voltage value) based at least on the determined rate of discharge. In one or more embodiments, the variable threshold voltage value may be stored via one or more of the battery management unit, an embedded controller of the mobile information handling system, and an operating system executing on the mobile information handling system, among others.

In one or more embodiments, the battery management unit may determine that the rate of discharge is below a rate of discharge threshold. For example, when the rate of discharge is below the rate of discharge threshold, more power may be utilized to transition the mobile information handling system to a low power state (e.g., ACPI power state "G3"). In one or more embodiments, the battery management unit may reserve an amount of rechargeable battery capacity (e.g., a "reserve tank") to transition the mobile information handling system to a low power state. For example, when the battery management unit determines that the rate of discharge is below the rate of discharge threshold, the battery management unit may increase the amount of rechargeable battery capacity (e.g., increase the "reserve tank") to transition the mobile information handling system to the low power state.

In one or more embodiments, the variable threshold voltage value (e.g., the "critical low" voltage value) may be associated with the amount of rechargeable battery capacity (e.g., the "reserve tank"). For example, when the battery management unit increases the amount of rechargeable battery capacity (e.g., increase the "reserve tank" for transition to the low power state), the battery management unit may set the variable threshold voltage value to a higher voltage value (e.g., may set the "critical low" voltage value to a higher voltage value).

In one or more embodiments, when the battery management unit determines that the rate of discharge is not below the rate of discharge threshold, the battery management unit may determine an amount of rechargeable battery capacity (e.g., determine a "reserve tank") to transition the mobile information handling system to the low power state. For example, the variable threshold voltage value (e.g., the "critical low" voltage value) may be associated with the amount of rechargeable battery capacity (e.g., the "reserve tank"). For instance, when the battery management unit determines that the rate of discharge is not below the rate of discharge threshold, the battery management unit may set may set the variable threshold voltage value to a lower voltage value (e.g., may set the "critical low" voltage value to a lower voltage value).

In one or more embodiments, the battery management unit may determine if the mobile information handling system has hibernated. If the mobile information handling system has not hibernated, the battery management unit may increase the variable threshold voltage value. For example, increasing the variable threshold voltage value may permit additional time to store data from a volatile memory medium of the mobile information handling system to a non-volatile memory medium. For instance, increasing the variable threshold voltage value may permit additional time to write data stored in RAM (random access memory) to a disk (e.g., a hard disk drive, a solid state disk drive, etc.). As an example, increasing the variable threshold voltage value may permit additional rechargeable battery capacity (e.g., additional "reserve tank") to transition to the low power state), which may support saving files of a user and/or files of an application to the non-volatile memory medium (e.g., the disk) without sacrificing a shelf life associated with the rechargeable battery. In one or more embodiments, one or more systems, one or more methods, and/or one or more processes described herein may adjust to mobile information handling system power consumption to reach an optimal balance between mobile information handling system runtime and rechargeable battery shelf life.

In one or more embodiments, the battery management unit may rely on an embedded controller of the mobile information handling system for keeping track of weekly mobile information handling system utilization patterns and/or events. For example, the battery management unit may retrieve data associated with weekly utilization patterns from the embedded controller. In one or more embodiments, the battery management unit may not include a real time clock (RTC). For example, the battery management unit may rely on the embedded controller for keeping track of the seven-day rolling period statistics, among others. In one instance, most "typical" users (e.g. regular schedule workers) may have a consistent Monday through Friday utilization patterns, where their mobile information handling systems may be "active" from 8:00 A.M. to 5:00 P.M. and may be put into low power modes 5:00 P.M. until 8:00 A.M. the following day (e.g., fifteen hours of "storage"). In another instance, the "typical" users may likely leave their mobile information handling systems in the low power modes from 5:00 P.M. Friday until 8:00 A.M. Monday (e.g., sixty-three hours of "storage").

In one or more embodiments, a rechargeable battery manage unit may predict that shelf life storage may be significantly reduced for the Monday through Friday mobile information handling system utilization and may be extended for Saturday through Sunday mobile information handling system utilization. In one example, this may result in additional working rechargeable battery runtime during a Monday through Friday schedule since an excess rechargeable battery reserve storage capacity may be converted to runtime capacity (e.g., due to a lower variable threshold voltage value ("critical low" voltage value)). In another example, for weekend utilization, the rechargeable battery manage unit may ensure that the rechargeable battery may not be associated with any issues from Friday evening through Monday morning without consuming a RTC reserve capacity.

In one or more embodiments, a battery management unit may utilize rechargeable battery characteristics to more predict a reserve capacity needed to meet a necessary shelf life or storage time of the rechargeable battery. In one example, a new rechargeable battery may be able to sustain a higher storage time for a cut-off point than an aged rechargeable battery. For instance, compensating for an age associated with a rechargeable battery may include raising a storage threshold associated with the rechargeable battery. In a second example, a temperature associated with a rechargeable battery may affect storage time. In another example, a rechargeable battery may vary from another rechargeable battery based at least on chemical composition and/or manufacture. For instance, a rechargeable battery may include low-grade cells as a cost effectiveness measure. In one or more embodiments, the battery management unit may store the rechargeable battery characteristics via a non-volatile storage.

In one or more embodiments, the battery management unit may track system off time periods on a daily basis to determine an amount of rechargeable battery reserve capacity needed to avoid risk of exhausting the reserve capacity. In one or more embodiments, the battery management unit may eliminate a need for trickle charge rechargeable battery mode exposure to a customer by dynamically keeping a reserve capacity large enough to avoid dropping below a trigger voltage. In one or more embodiments, the battery management unit may optimize rechargeable battery runtime by avoidance of sandbagging a lowest common denominator value for a rechargeable battery reserve capacity. In one or more embodiments, the battery management unit may avoid over discharging a rechargeable battery. In one example, the battery management unit may eliminate a long, forced trickle charge mode until the rechargeable battery reaches normal operation voltage levels. For instance, when a rechargeable battery is over discharged, it may need to be reconditioned via a long, forced trickle charge mode until the rechargeable battery reaches normal operation voltage levels. In another example, the battery management unit may eliminate a potential loss of a RTC feature and possibly even a permanent failure of the batter.

Turning now to FIG. 1A, an example of an information handling system is illustrated, according to one or more embodiments. An information handling system (IHS) 110 may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, IHS 110 may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS 110 may include or have a form factor of that of or similar to one or more of a laptop, a notebook, a telephone, a tablet, and a PDA, among others. For example, a portable IHS 110 may be readily carried and/or transported by a user (e.g., a person). In one or more embodiments, a mobile IHS 110 may be a portable IHS 110. For example, IHS 110 may be a mobile IHS 110

In one or more embodiments, components of IHS 110 may include one or more storage devices, one or more communications ports for communicating with external devices as well as various input and output (I/O) devices, such as a keyboard, a mouse, and a video display, among others. In one or more embodiments, IHS 110 may include one or more buses operable to transmit communication between or among two or more hardware components. In one example, a bus of IHS 110 may include one or more of a memory bus, a peripheral bus, and a local bus, among others. In another example, a bus of IHS 110 may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, IHS 110 may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

As shown, IHS 110 may include a processor 120, an embedded controller (EC) 130, a volatile memory medium 150, non-volatile memory media 160 and 170, an I/O subsystem 175, and a network interface 180. As illustrated, EC 130, volatile memory medium 150, non-volatile memory media 160 and 170, I/O subsystem 175, and network interface 180 may be communicatively coupled to processor 120.

In one or more embodiments, one or more of EC 130, volatile memory medium 150, non-volatile memory media 160 and 170, I/O subsystem 175, and network interface 180 may be communicatively coupled to processor 120 via one or more buses, one or more switches, and/or one or more root complexes, among others. In one example, one or more of EC 130, volatile memory medium 150, non-volatile memory media 160 and 170, I/O subsystem 175, and network interface 180 may be communicatively coupled to processor 120 via one or more PCI-Express (PCIe) root complexes. In another example, one or more of EC 130, I/O subsystem 175, and network interface 180 may be communicatively coupled to processor 120 via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

Volatile memory medium 150 may include volatile storage such as, for example, RAM, DRAM (dynamic RAM), EDO RAM (extended data out RAM), SRAM (static RAM), etc. One or more of non-volatile memory media 160 and 170 may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, network interface 180 may be utilized in communicating with one or more networks and/or one or more other information handling systems. In one example, network interface 180 may enable IHS 110 to communicate via a network utilizing a suitable transmission protocol and/or standard. In a second example, network interface 180 may be coupled to a wired network. In a third example, network interface 180 may be coupled to an optical network. In another example, network interface 180 may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, network interface 180 may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, processor 120 may execute processor instructions in implementing at least a portion of one or more systems, at least a portion of one or more flowcharts, at least a portion of one or more methods, and/or at least a portion of one or more processes described herein. In one example, processor 120 may execute processor instructions from one or more of memory media 150, 160, and 170 in implementing at least a portion of one or more systems, at least a portion of one or more flowcharts, at least a portion of one or more methods, and/or at least a portion of one or more processes described herein. In another example, processor 120 may execute processor instructions via network interface 180 in implementing at least a portion of one or more systems, at least a portion of one or more flowcharts, at least a portion of one or more methods, and/or at least a portion of one or more processes described herein.

In one or more embodiments, processor 120 may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, processor 120 may interpret and/or execute program instructions and/or process data stored locally (e.g., via memory media 150, 160, and 170 and/or another component of IHS 110). In another example, processor 120 may interpret and/or execute program instructions and/or process data stored remotely (e.g., via a network storage resource).

In one or more embodiments, I/O subsystem 175 may represent a variety of communication interfaces, graphics interfaces, video interfaces, user input interfaces, and/or peripheral interfaces, among others. For example, I/O subsystem 175 may include one or more of a touch panel and a display adapter, among others. For instance, a touch panel may include circuitry that enables touch functionality in conjunction with a display that is driven by a display adapter.

As shown, non-volatile memory medium 160 may include an operating system (OS) 162, and applications (APPs) 164-168. In one or more embodiments, one or more of OS 162 and APPs 164-168 may include processor instructions executable by processor 120. In one example, processor 120 may execute processor instructions of one or more of OS 162 and APPs 164-168 via non-volatile memory medium 160. In another example, one or more portions of the processor instructions of the one or more of OS 162 and APPs 164-168 may be transferred to volatile memory medium 150, and processor 120 may execute the one or more portions of the processor instructions of the one or more of OS 162 and APPs 164-168 via volatile memory medium 150.

As illustrated, non-volatile memory medium 170 may include information handling system firmware (IHSFW) 172. In one or more embodiments, IHSFW 172 may include processor instructions executable by processor 120. For example, IHSFW 172 may include one or more structures and/or one or more functionalities of and/or compliant with one or more of a basic input/output system (BIOS), an Extensible Firmware Interface (EFI), a Unified Extensible Firmware Interface (UEFI), and an ACPI, among others. In one instance, processor 120 may execute processor instructions of IHSFW 172 via non-volatile memory medium 170. In another instance, one or more portions of the processor instructions of IHSFW 172 may be transferred to volatile memory medium 150, and processor 120 may execute the one or more portions of the processor instructions of IHSFW 172 via volatile memory medium 150.

In one or more embodiments, processor 120 and one or more components of IHS 110 may be included in a system-on-chip (SoC). For example, the SoC may include processor 120 and a platform controller hub (not specifically illustrated). In one or more embodiments, IHS 110 may include a RTC 132. For example, RTC 132 may be coupled to BMC 130. In one instance, RTC 132 may be external to BMC 130, as illustrated. In another instance, BMC 130 may include RTC 132, not specifically illustrated.

In one or more embodiments, RTC 132 may include an electronic device (e.g., an integrated circuit) that measures passage of time. For example, the electronic device of RTC 132 may utilize a crystal oscillator in measuring the passage of time. In one or more embodiments, RTC 132 may provide time information to a component of IHS 110. In one example, the time information may include a number of seconds. In one instance, the time information may include a number of seconds since an epoch. In a second instance, the time information may include a number of seconds since IHS 110 was powered on. In another instance, the time information may include a number of seconds of a current minute. In a second example, the time information may include a number of minutes. In one instance, the time information may include a number of minutes since IHS 110 was powered on. In another instance, the time information may include a number of minutes of a current hour. In a third example, the time information may include a number of hours. In one instance, the time information may include a number of hours since IHS 110 was powered on. In another instance, the time information may include a number of hours of a current day (e.g., using twelve hour time, using twenty-four hour time, etc.). In a fourth example, the time information may include a day of a week. In one instance, the day of the week may be a number (e.g., 0, 1, 2, 3, etc.). In another instance, the day of the week may be a string (e.g., "Monday", "Tuesday", etc.). In a fifth example, the time information may include a number of days. In one instance, the time information may include a number of days since IHS 110 was powered on. In a second instance, the time information may include a number of days of a current month. In another instance, the time information may include a number of days of a current year. In another example, the time information may include a number of years.

In one or more embodiments, IHS 110 may include a rechargeable battery 190. In one example, rechargeable battery 190 may store energy. In another example, rechargeable battery 190 may provide power to one or more components of IHS 110. For instance, the one or more components of IHS 110 may include processor 120, EC 130, RTC 132, volatile memory medium 150, non-volatile memory media 160 and 170, I/O subsystem 175, and network interface 180, among others. In one or more embodiments, rechargeable battery 190 may provide power to one or more components external to IHS 110. For example, the one or more components external to IHS 110 may include an external pointing device (e.g., a mouse, a touchpad, etc.), an external keyboard, a drive (e.g., a thumb drive, a portable storage device, etc.), and an external display, among others. In one or more embodiments, rechargeable battery 190 may include one or more rechargeable cells. For example, rechargeable battery 190 may include multiple rechargeable cells. In one instance, two or more of the multiple rechargeable cells may be arranged in series. In a second instance, two or more of the multiple rechargeable cells may be arranged in parallel. In another instance, two or more of the multiple rechargeable cells may be arranged in various combinations of series and parallel.

In one or more embodiments, rechargeable battery 190 may include a battery management unit (BMU) 191. For example, BMU 191 may include an electronic system that manages rechargeable battery 190. For instance, BMU 191 may protect rechargeable battery 190 from operating outside a safe operating area, may determine one or more states associated with rechargeable battery 190 (e.g., state of charge, state of health, state of power, state of safety, etc.), may determine data associated with rechargeable battery 190, may determine data associated with one or more cells of rechargeable battery 190, may report the data associated with rechargeable battery 190, may report the data associated with the one or more cells of rechargeable battery 190, may control an environment associated with rechargeable battery 190, authenticating rechargeable battery 190, and/or may charge balancing two or more cells of rechargeable battery 190, among others.

In one or more embodiments, BMU 191 may be or include a microcontroller. For example, the microcontroller may be configured, coded, and/or encoded with instructions in accordance with at least a portion of one or more of systems, at least a portion of one or more flowcharts, at least a portion of one or more methods, and/or at least a portion of one or more processes described herein. For instance, the microcontroller may be or include an 8051 microcontroller, an ARM Cortex-M (e.g., Cortex-M0, Cortex-M1, Cortex-M3, Cortex-M4, etc.) microcontroller, a MSP430 microcontroller, an AVR (e.g., 8-bit AVR, AVR-32, etc.) microcontroller, a PIC microcontroller, a 68HC11 microcontroller, and a Renesas microcontroller, among others. In one or more embodiments, BMU 191 may be or include one or more of a field programmable gate array (FPGA) and an ASIC, among others, configured, coded, and/or encoded with instructions in accordance with at least a portion of one or more of systems, at least a portion of one or more flowcharts, at least a portion of one or more methods, and/or at least a portion of one or more processes described herein.

In one or more embodiments, EC 130 may be or include a remote access controller. For example, the remote access controller may be or include a DELL™ Remote Access Controller (DRAC). In one or more embodiments, a remote access controller may be integrated into IHS 110. For example, the remote access controller may be or include an integrated DELL™ Remote Access Controller (iDRAC). In one or more embodiments, a remote access controller may include one or more of a processor, a memory, and a network interface, among others. In one or more embodiments, a remote access controller may access one or more busses and/or one or more portions of IHS 110. For example, the remote access controller may include and/or may provide power management, virtual media access, and/or remote console capabilities, among others, which may be available via a web browser and/or a command line interface. For instance, the remote access controller may provide and/or permit an administrator (e.g., a user) one or more abilities to configure and/or maintain an information handling system as if the administrator was at a console of the information handling system and/or had physical access to the information handling system.

In one or more embodiments, a remote access controller may interface with baseboard management controller integrated circuits. In one example, the remote access controller may be based at least on an Intelligent Platform Management Interface (IPMI) standard. For instance, the remote access controller may allow and/or permit utilization of IPMI out-of-band interfaces such as IPMI Over LAN (local area network). In another example, the remote access controller may be based at least on a Redfish standard. In one instance, one or more portions of the remote access controller may be compliant with one or more portions of a Redfish standard. In another instance, one or more portions of the remote access controller may implement one or more portions of a Redfish standard. In one or more embodiments, a remote access controller may include and/or provide one or more internal private networks. For example, the remote access controller may include and/or provide one or more of an Ethernet interface, a front panel USB interface, and a Wi-Fi interface, among others. In one or more embodiments, a remote access controller may be, include, or form at least a portion of a virtual KVM (keyboard, video, and mouse) device. For example, a remote access controller may be, include, or form at least a portion of a KVM over IP (IPKVM) device. For instance, a remote access controller may capture video, keyboard, and/or mouse signals; may convert the signals into packets; and may provide the packets to a remote console application via a network.

In one or more embodiments, EC 130 may be or include a microcontroller. For example, the microcontroller may be or include an 8051 microcontroller, an ARM Cortex-M (e.g., Cortex-M0, Cortex-M1, Cortex-M3, Cortex-M4, Cortex-M7, etc.) microcontroller, a MSP430 microcontroller, an AVR (e.g., 8-bit AVR, AVR-32, etc.) microcontroller, a PIC microcontroller, a 68HC11 microcontroller, a ColdFire microcontroller, and a Renesas microcontroller, among others. In one or more embodiments, EC 130 may be or include an application processor. In one example, EC 130 may be or include an ARM Cortex-A processor. In another example, EC 130 may be or include an Intel Atom processor. In one or more embodiments, EC 130 may be or include one or more of a FPGA and an ASIC, among others, configured, coded, and/or encoded with instructions in accordance with at least a portion of one or more of systems, at least a portion of one or more flowcharts, at least a portion of one or more methods, and/or at least a portion of one or more processes described herein.

Figure 1B:
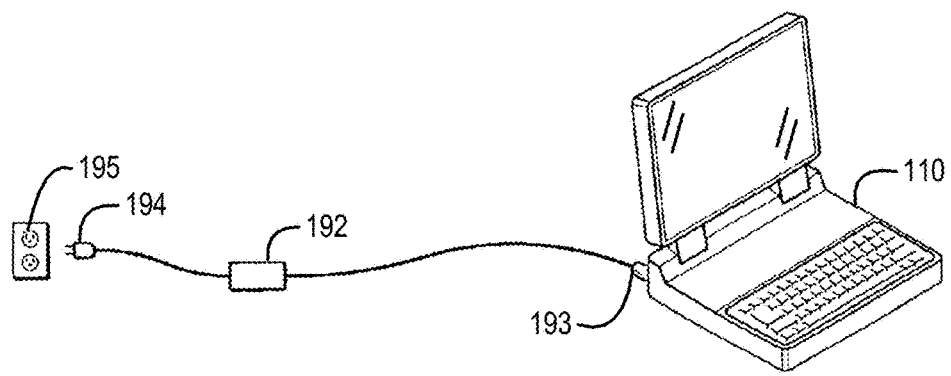
FIG. 1B illustrates another example of an information handling system, according to one or more embodiments.

Turning now to FIG. 1B, another example of an information handling system is illustrated, according to one or more embodiments. In one or more embodiments, IHS 110 may be a mobile information handling system. For example, IHS 110 may be coupled to an external power supply 192. In one instance, IHS 110 may receive power from external power supply 192 to power one or more components of IHS 110. In another instance, IHS 110 may receive power from external power supply 192 to charge rechargeable battery 190.

In one or more embodiments, IHS 110 may be coupled to external power supply 192 via a plug 193. In one or more embodiments, external power supply 192 may be coupled to a plug 194. For example, plug 194 may be plugged into a receptacle 195. For instance, receptacle 195 may be a wall receptacle, which may provide alternating current (AC) to power supply 192. In one or more embodiments, external power supply 192 may receive AC power via plug 194 from plug 195. For example, external power supply 192 may provide direct current (DC) power to IHS 110 via plug 193.

Figure 2:
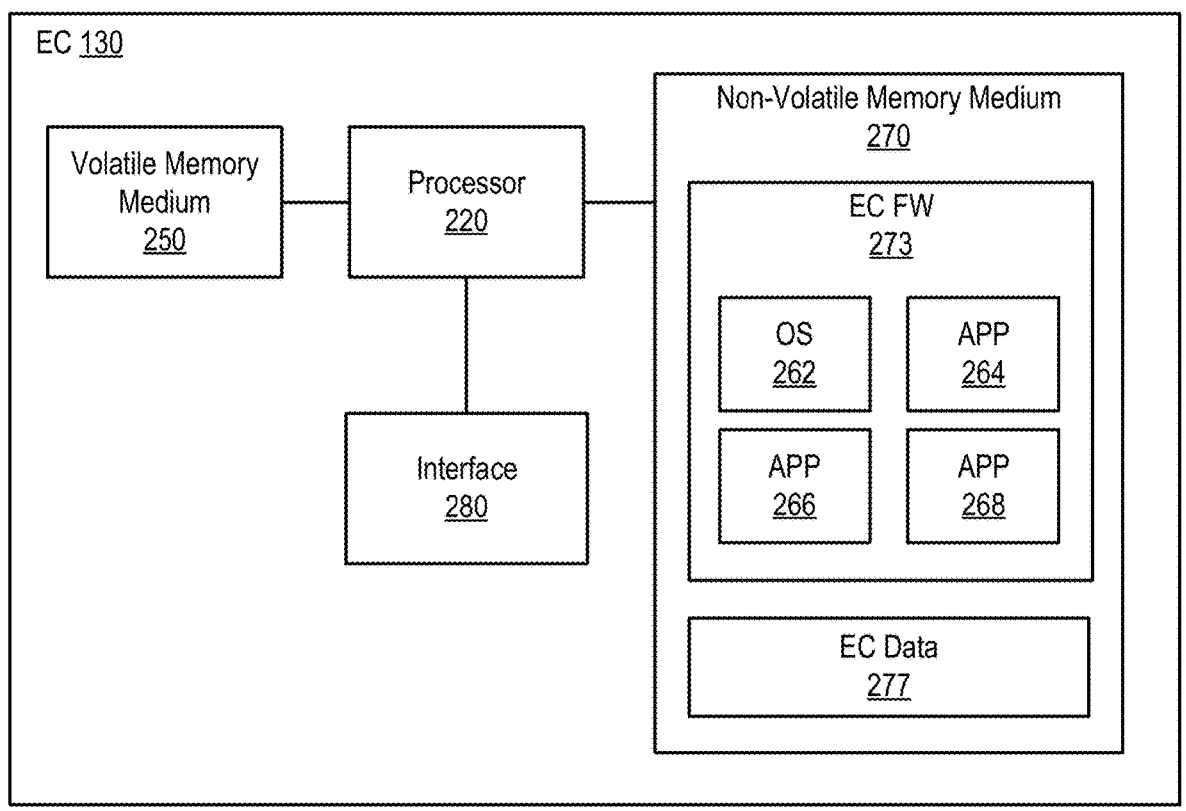
FIG. 2 illustrates an example of an embedded controller, according to one or more embodiments.

Turning now to FIG. 2, an example of an embedded controller is illustrated, according to one or more embodiments. As shown, EC 130 may include a processor 220, a volatile memory medium 250, a non-volatile memory medium 270, and an interface 280. As illustrated, non-volatile memory medium 270 may include a EC firmware (FW) 273, which may include an OS 262 and APPs 264-268, and may include EC data 277. In one example, OS 262 may be or include a real-time operating system (RTOS). For instance, the RTOS may be or include FreeRTOS, OpenRTOS, SafeRTOS, QNX, ThreadX, VxWorks, NuttX, TI-RTOS, eCos, MicroC/OS, or Zephyr, among others. In a second example, OS 262 may be or include an Unix-like operating system. For instance, the Unix-like operating system may be or include LINUX®, FREEB SD®, NETBSD®, OpenBSD, Minix, Xinu, or Darwin, among others. In another example, OS 262 may be or include a portable operating system interface (POSIX) compliant operating system.

In one or more embodiments, interface 280 may include circuitry that enables communicatively coupling to one or more devices. In one example, interface 280 may include circuitry that enables communicatively coupling to one or more buses. For instance, the one or more buses may include one or more buses described herein, among others. In a second example, interface 280 may include circuitry that enables one or more interrupt signals to be received. In one instance, interface 280 may include general purpose input/output (GPIO) circuitry, and the GPIO circuitry may enable one or more interrupt signals to be received and/or provided via at least one interrupt line. In another instance, interface 280 may include GPIO circuitry that may enable EC 130 to provide and/or receive signals associated with other circuitry (e.g., diagnostic circuitry, etc.). In a third example, interface 280 may include circuitry that enables communicatively coupling to one or more networks. In one instance, interface 280 may include circuitry that enables communicatively coupling to network interface 180. In another example, interface 280 may include a network interface.

In one or more embodiments, one or more of OS 262 and APPs 264-268 may include processor instructions executable by processor 220. In one example, processor 220 may execute processor instructions of one or more of OS 262 and APPs 264-268 via non-volatile memory medium 270. In another example, one or more portions of the processor instructions of the one or more of OS 262 and APPs 264-268 may be transferred to volatile memory medium 250, and processor 220 may execute the one or more portions of the processor instructions of the one or more of OS 262 and APPs 264-268 via volatile memory medium 250. In one or more embodiments, processor 220 may execute instructions in accordance with at least a portion of one or more systems, at least a portion of one or more flowcharts, one or more methods, and/or at least a portion of one or more processes described herein. For example, non-volatile memory medium 270 and/or volatile memory medium 250 may store instructions that may be executable in accordance with at least a portion of one or more systems, at least a portion of one or more flowcharts, at least a portion of one or more methods, and/or at least a portion of one or more processes described herein. In one or more embodiments, processor 220 may execute instructions in accordance with at least a portion of one or more of systems, flowcharts, at least a portion of one or more methods, and/or at least a portion of one or more processes described herein. For example, non-volatile memory medium 270 and/or volatile memory medium 250 may store instructions that may be executable in accordance with at least a portion of one or more of systems, at least a portion of one or more flowcharts, at least a portion of one or more methods, and/or at least a portion of one or more processes described herein. In one or more embodiments, processor 220 may utilize EC data 277. In one example, processor 220 may utilize EC data 277 via non-volatile memory medium 270. In another example, one or more portions of EC data 277 may be transferred to volatile memory medium 250, and processor 220 may utilize EC data 277 via volatile memory medium 250.

Figure 3:
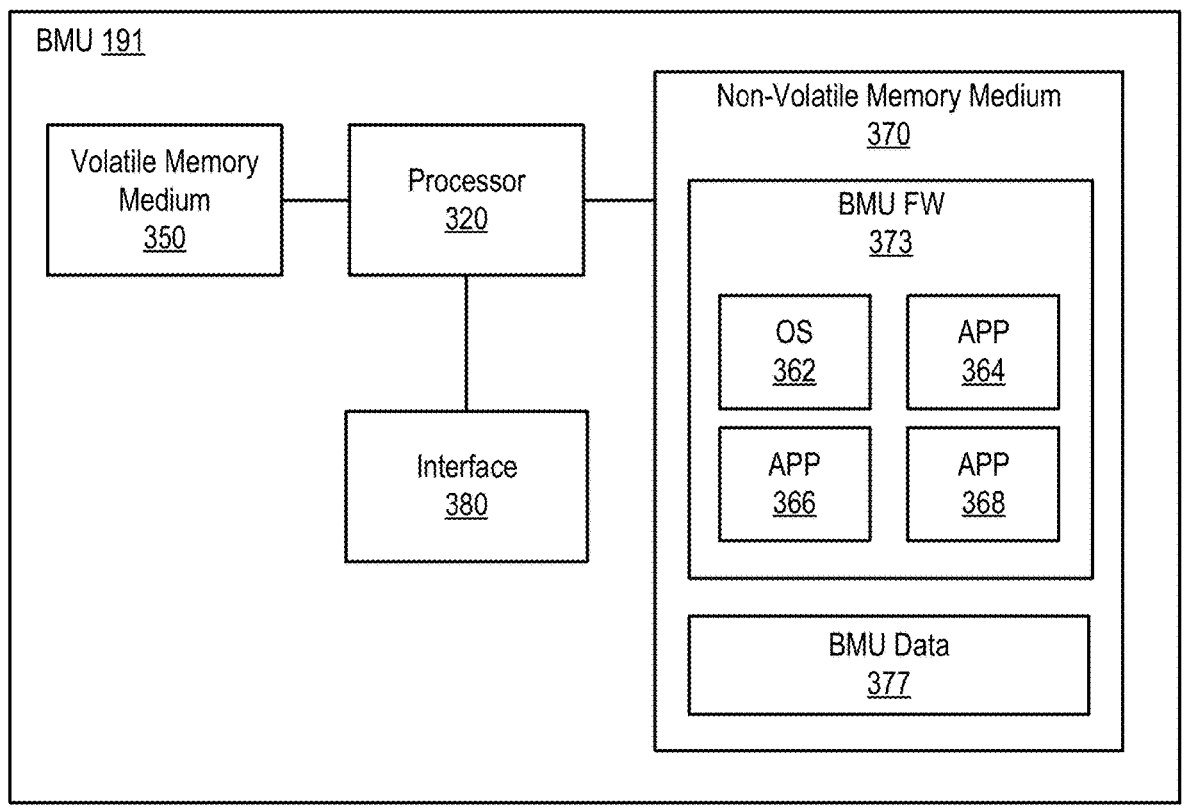
FIG. 3 illustrates an example of a battery management unit, according to one or more embodiments.

Turning now to FIG. 3, an example of a battery management unit is illustrated, according to one or more embodiments. As shown, BMU 191 may include a processor 320, a volatile memory medium 350, a non-volatile memory medium 370, and an interface 380. As illustrated, non-volatile memory medium 370 may include a BMU firmware (FW) 373, which may include an OS 362 and APPs 364-368, and may include BMU data 377. In one example, OS 362 may be or include a RTOS. For instance, the RTOS may be or include FreeRTOS, OpenRTOS, SafeRTOS, QNX, ThreadX, VxWorks, NuttX, TI-RTOS, eCos, MicroC/OS, or Zephyr, among others. In a second example, OS 362 may be or include an Unix-like operating system. For instance, the Unix-like operating system may be or include LINUX®, FREEBSD®, NETBSD®, OpenBSD, Minix, Xinu, or Darwin, among others. In another example, OS 362 may be or include a POSIX compliant operating system.

In one or more embodiments, interface 380 may include circuitry that enables communicatively coupling to one or more devices. In one example, interface 380 may include circuitry that enables communicatively coupling to one or more buses. For instance, the one or more buses may include one or more buses described herein, among others. In a second example, interface 380 may include circuitry that enables one or more interrupt signals to be received. In one instance, interface 380 may include GPIO circuitry, and the GPIO circuitry may enable one or more interrupt signals to be received and/or provided via at least one interrupt line. In another instance, interface 380 may include GPIO circuitry that may enable BMU 191 to provide and/or receive signals associated with other circuitry (e.g., diagnostic circuitry, etc.). In a third example, interface 380 may include circuitry that enables communicatively coupling to one or more networks. In one instance, interface 380 may include circuitry that enables communicatively coupling to network interface 180. In another example, interface 380 may include a network interface.

In one or more embodiments, one or more of OS 362 and APPs 364-368 may include processor instructions executable by processor 320. In one example, processor 320 may execute processor instructions of one or more of OS 362 and APPs 364-368 via non-volatile memory medium 370. In another example, one or more portions of the processor instructions of the one or more of OS 362 and APPs 364-368 may be transferred to volatile memory medium 350, and processor 320 may execute the one or more portions of the processor instructions of the one or more of OS 362 and APPs 364-368 via volatile memory medium 350. In one or more embodiments, processor 320 may execute instructions in accordance with at least a portion of one or more systems, at least a portion of one or more flowcharts, one or more methods, and/or at least a portion of one or more processes described herein. For example, non-volatile memory medium 370 and/or volatile memory medium 350 may store instructions that may be executable in accordance with at least a portion of one or more systems, at least a portion of one or more flowcharts, at least a portion of one or more methods, and/or at least a portion of one or more processes described herein. In one or more embodiments, processor 320 may execute instructions in accordance with at least a portion of one or more of systems, flowcharts, at least a portion of one or more methods, and/or at least a portion of one or more processes described herein. For example, non-volatile memory medium 370 and/or volatile memory medium 350 may store instructions that may be executable in accordance with at least a portion of one or more of systems, at least a portion of one or more flowcharts, at least a portion of one or more methods, and/or at least a portion of one or more processes described herein. In one or more embodiments, processor 320 may utilize BMU data 377. In one example, processor 320 may utilize BMU data 377 via non-volatile memory medium 370. In another example, one or more portions of BMU data 377 may be transferred to volatile memory medium 350, and processor 320 may utilize BMU data 377 via volatile memory medium 350.

Figure 4A:
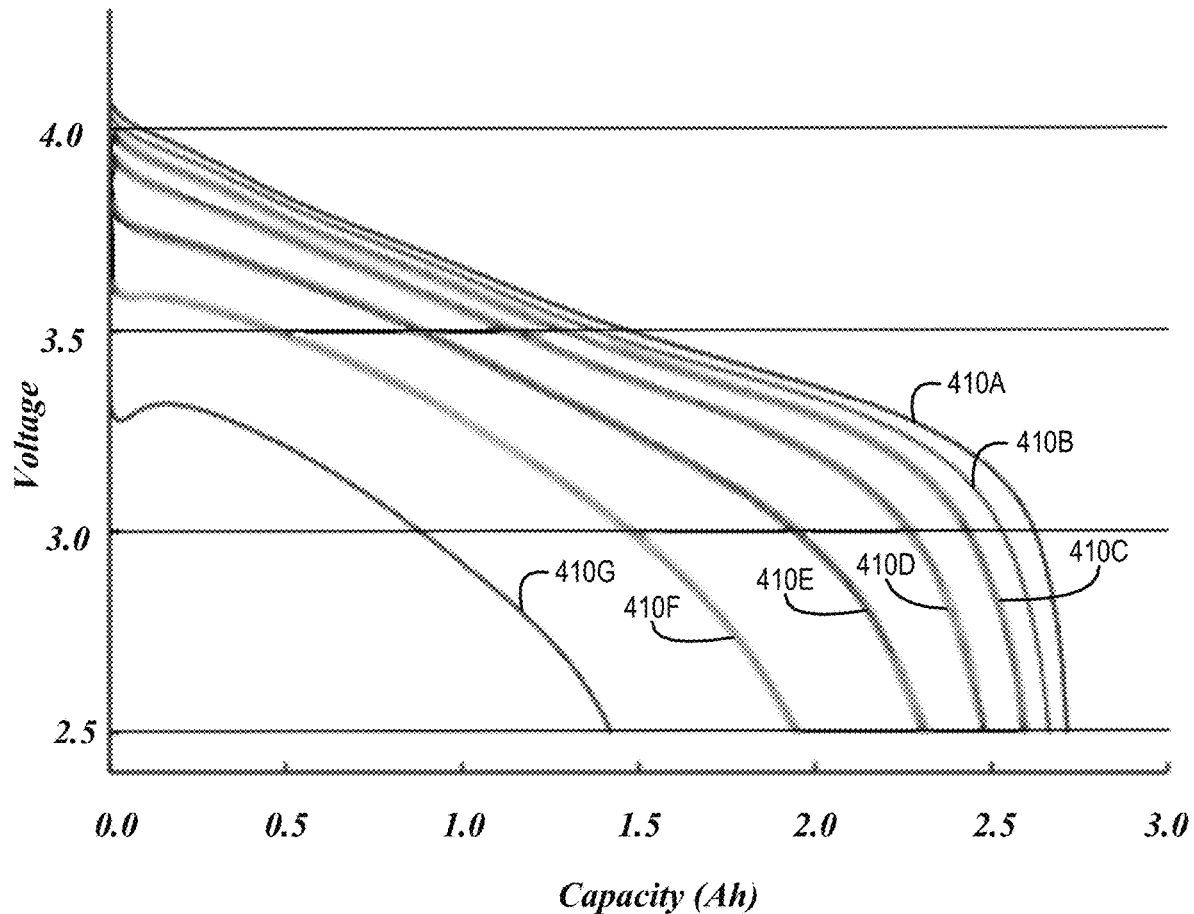
FIG. 4A illustrates example plots of voltage versus rechargeable battery capacity at multiple temperatures, according to one or more embodiments.

Turning now to FIG. 4A, example plots of voltage versus rechargeable battery capacity at multiple temperatures are illustrated, according to one or more embodiments. In one or more embodiments, a voltage value of rechargeable battery 190 may be associated with a capacity value of rechargeable battery 190. In one example, voltage values of rechargeable battery 190 may decrease as capacity values of rechargeable battery 190 decrease. In another example, voltage values of rechargeable battery 190 may increase as capacity values of rechargeable battery 190 increase.

In one or more embodiments, a voltage value of rechargeable battery 190 may be associated with a temperature associated with rechargeable battery 190. In one example, voltage values of rechargeable battery 190 may decrease as temperature values associated with rechargeable battery 190 decrease. In another example, voltage values of rechargeable battery 190 may increase as temperature values associated with rechargeable battery 190 increase. As an example, a plot 410A illustrates voltage values of rechargeable battery 190 versus capacity values of rechargeable battery 190 at forty degrees Celsius (40° C.). As a second example, a plot 410B illustrates voltage values of rechargeable battery 190 versus capacity values of rechargeable battery 190 at thirty degrees Celsius (30° C.). As a third example, a plot 410C illustrates voltage values of rechargeable battery 190 versus capacity values of rechargeable battery 190 at twenty degrees Celsius (20° C.). As a fourth example, a plot 410D illustrates voltage values of rechargeable battery 190 versus capacity values of rechargeable battery 190 at ten degrees Celsius (10° C.). As a fifth example, a plot 410E illustrates voltage values of rechargeable battery 190 versus capacity values of rechargeable battery 190 at zero degrees Celsius (0° C.). As a sixth example, a plot 410F illustrates voltage values of rechargeable battery 190 versus capacity values of rechargeable battery 190 at negative ten degrees Celsius (−10° C.). As another example, a plot 410G illustrates voltage values of rechargeable battery 190 versus capacity values of rechargeable battery 190 at negative twenty degrees Celsius (−20° C.).

Figure 4B:
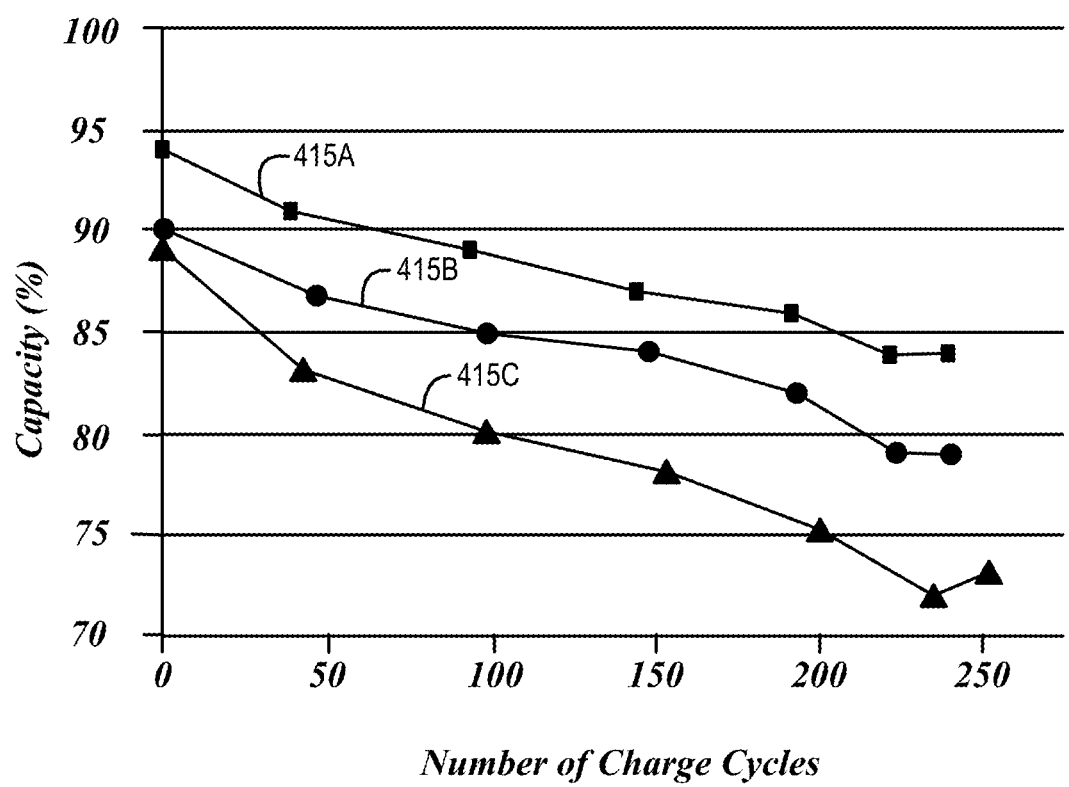
FIG. 4B illustrates example plots of charge capacity percentage versus number of charge cycles of multiple different rechargeable batteries, according to one or more embodiments.

Turning now to FIG. 4B, example plots of charge capacity percentage versus number of charge cycles of multiple different rechargeable batteries are illustrated, according to one or more embodiments. In one or more embodiments, different rechargeable cells may be associated with different grades. In one example, a first rechargeable cell may be associated with a first grade. For instance, a plot 415A may illustrate charge capacity percentage versus a number of charge cycles of the first rechargeable cell associated with the first grade. In a second example, a second rechargeable cell may be associated with a second grade. For instance, a plot 415B may illustrate charge capacity percentage versus a number of charge cycles of the second rechargeable cell associated with the second grade. In another example, a third rechargeable cell may be associated with a third grade. For instance, a plot 415B may illustrate charge capacity percentage versus a number of charge cycles of the third rechargeable cell associated with the third grade.

As shown, the first rechargeable cell associated with the first grade may be better than the second rechargeable cell associated with the second grade. For example, the first rechargeable cell may be associated with a higher capacity percentage than the second rechargeable cell as the number of charge cycles start off and/or increase. As illustrated, the second rechargeable cell associated with the second grade may be better than the third rechargeable cell associated with the third grade. For example, the second rechargeable cell may be associated with a higher capacity percentage than the third rechargeable cell as the number of charge cycles start off and/or increase.

Figure 5A:
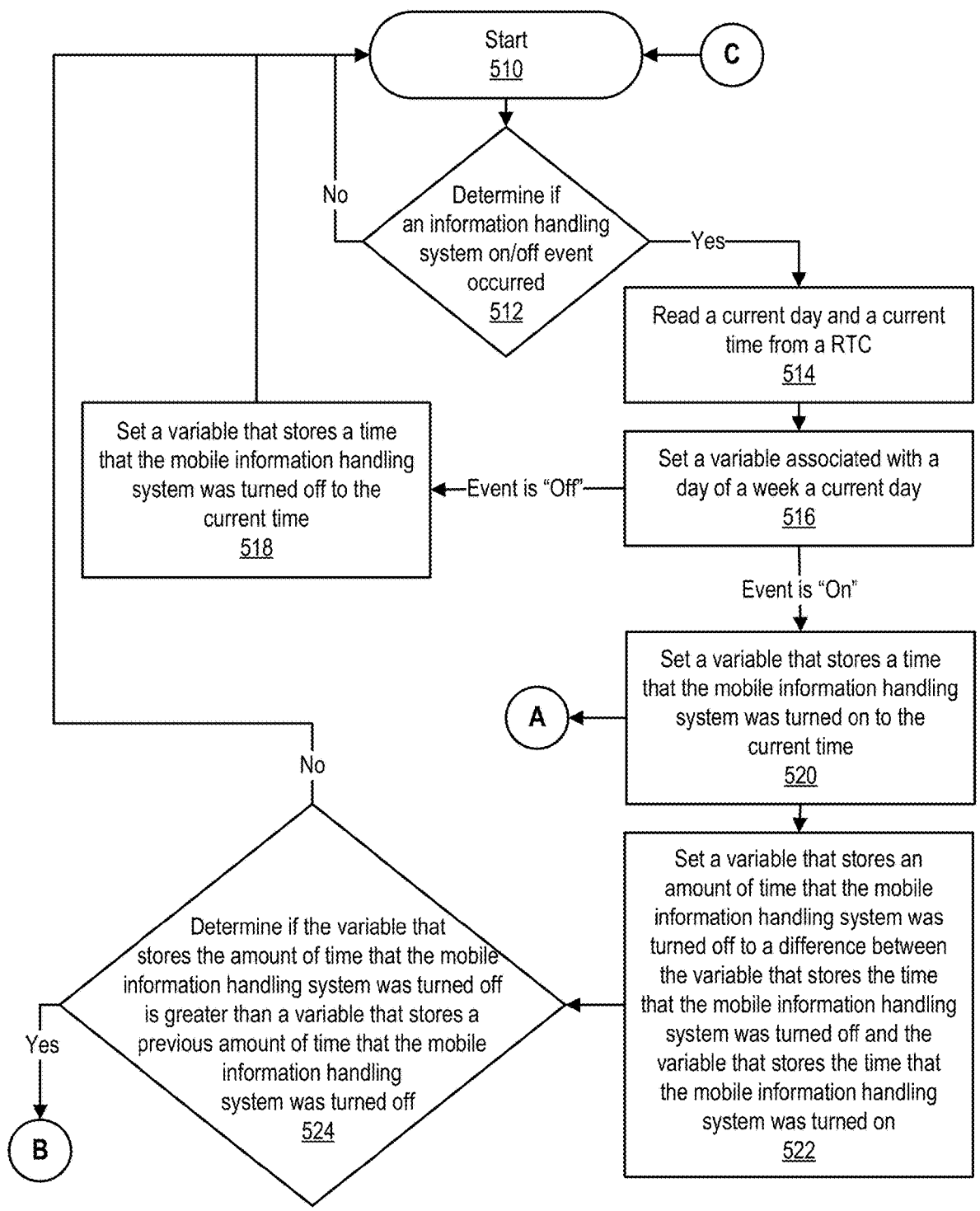
FIGS. 5A and 5B illustrate an example of operating a mobile information handling system, according to one or more embodiments.
Figure 5B:
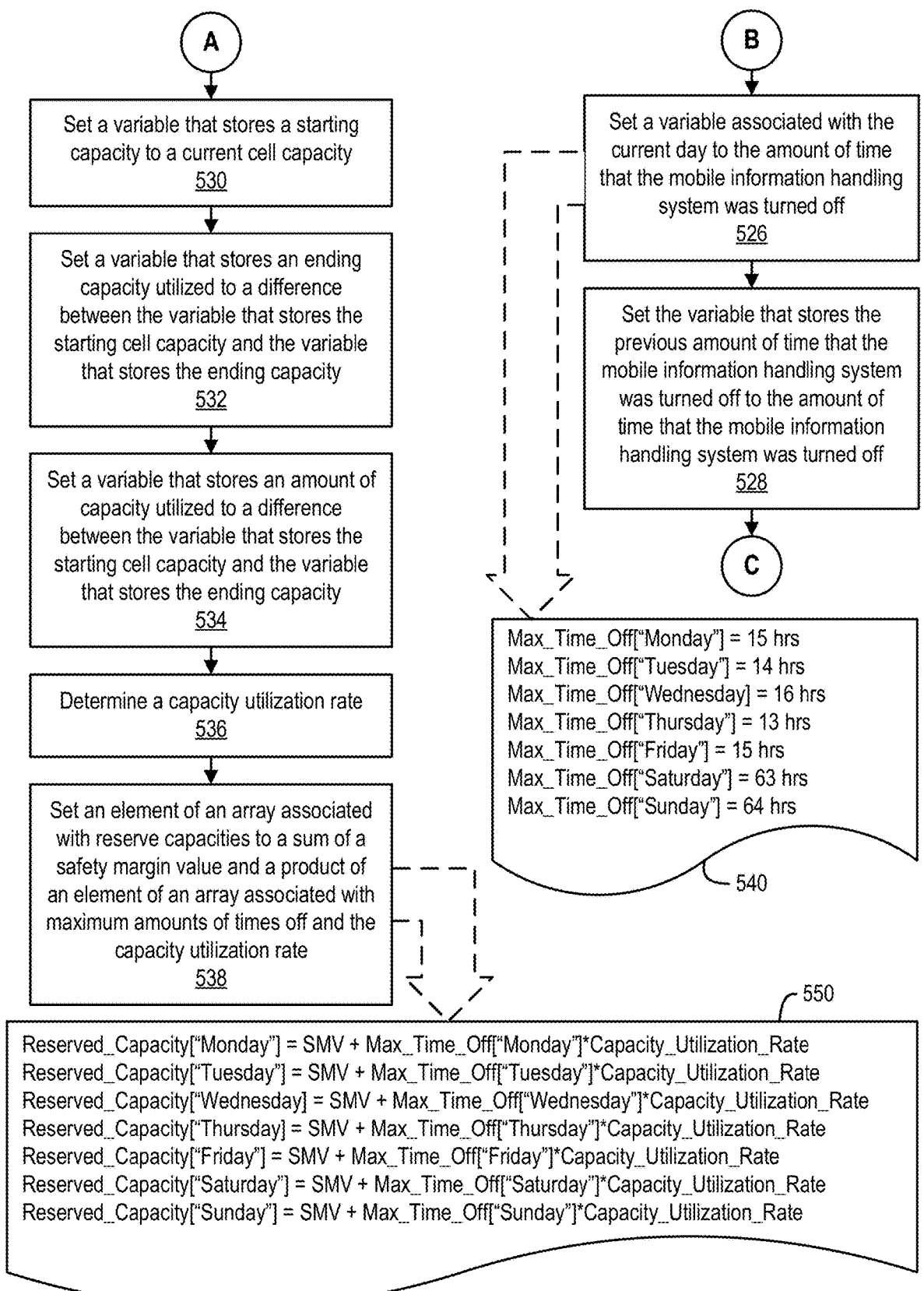

Turning now to FIGS. 5A and 5B, an example of operating a mobile information handling system is illustrated, according to one or more embodiments. At 510, the method may start. At 512, it may be determined if a mobile information handling system on/off event occurred. In one example, BMC 130 may determine if an on/off event associated with IHS 110 occurred. In another example, BMU 191 may determine if an on/off event associated with IHS 110 occurred. In one or more embodiments, determining if a mobile information handling system on/off event occurred may include determining if information associated with an event indicates that the mobile information handling system is to be turned off or indicates that the mobile information handling system is to be turned on.

If a mobile information handling system on/off event has not occurred, the method may proceed to 510, according to one or more embodiments. If a mobile information handling system on/off event has occurred, a current day and a current time may be read from a RTC, at 514. For example, BMC 130 may read a current day and a current time may be read from RTC 132. For instance, reading the current day and the current time from RTC 132 may include receiving the current day and the current time from RTC 132.

At 516, a variable associated with a day of a week may be set to the current day. In one example, BMC 130 may set a variable associated with a day of a week to the current day. In another example, BMU 191 may set a variable associated with a day of a week to the current day. For instance, BMU 191 may receive the current day from BMC 130.

At 518, a variable that stores a time that the mobile information handling system was turned off may be set to the current time, if the on/off event was "off". In one example, BMC 130 may set a variable that stores a time that IHS 110 was turned off to the current time. In another example, BMU 191 may set a variable may set a variable that stores a time that IHS 110 was turned off to the current time. For instance, BMU 191 may receive the current time from BMC 130. In one or more embodiments, the method may proceed to 510. In one or more embodiments, a variable that stores a starting cell capacity may be set to a current cell capacity. For example, setting the variable that stores the starting cell capacity to the current cell capacity may be performed by or with method element 518. In one instance, BMC 130 may set the variable that stores the starting cell capacity to the current cell capacity. In another instance, BMU 191 may set the variable that stores the starting cell capacity to the current cell capacity.

At 520, a variable that stores a time that the mobile information handling system was turned on may be set to the current time, if the on/off event was "on". In one example, BMC 130 may set a variable that stores a time that IHS 110 was turned on to the current time. In another example, BMU 191 may set a variable may set a variable that stores a time that IHS 110 was turned on to the current time. In one instance, BMU 191 may receive the current time from BMC 130. In another instance, BMU 191 may receive the current time from RTC 132.

At 522, a variable that stores an amount of time that the mobile information handling system was turned off may be set to a difference between the variable that stores the time that the mobile information handling system was turned off and the variable that stores the time that the mobile information handling system was turned on. In one example, BMC 130 may set a variable that stores an amount of time that the mobile information handling system was turned off to a difference between the variable that stores the time that the mobile information handling system was turned off and the variable that stores the time that the mobile information handling system was turned on. In another example, BMU 191 may set a variable that stores an amount of time that the mobile information handling system was turned off to a difference between the variable that stores the time that the mobile information handling system was turned off and the variable that stores the time that the mobile information handling system was turned on.

At 524, it may be determined if the variable that stores the amount of time that the mobile information handling system was turned off is greater than a variable that stores a previous amount of time that the mobile information handling system was turned off. In one example, BMC 130 may determine if the variable that stores the amount of time that the mobile information handling system was turned off is greater than a variable that stores a previous amount of time that the mobile information handling system was turned off. In another example, BMU 191 may determine if the variable that stores the amount of time that the mobile information handling system was turned off is greater than a variable that stores a previous amount of time that the mobile information handling system was turned off.

If the variable that stores the amount of time that the mobile information handling system was turned off is not greater than the variable that stores the previous amount of time that the mobile information handling system was turned off, the method may proceed to 510, according to one or more embodiments. If the variable that stores the amount of time that the mobile information handling system was turned off is greater than the variable that stores the previous amount of time that the mobile information handling system was turned off, a variable associated with the current day may be set to the amount of time that the mobile information handling system was turned off, at 526. In one example, BMC 130 may set a variable associated with the current day to the amount of time that the mobile information handling system was turned off. In another example, BMU 191 may set a variable associated with the current day to the amount of time that the mobile information handling system was turned off.

In one or more embodiments, setting the a variable associated with the current day to the amount of time that the mobile information handling system was turned off may include setting an element of an array associated with days of a week. For example, an array 540 associated with days of the week may store the amount of time that the mobile information handling system was turned off for each day of the week. For instance, an element of array 540 associated with the current day of the week may be set to the amount of time that the mobile information handling system was turned off, at 526.

At 528, the variable that stores the previous amount of time that the mobile information handling system was turned off may be set to the amount of time that the mobile information handling system was turned off. In one example, BMC 130 may set the variable that stores the previous amount of time that the mobile information handling system was turned off to the amount of time that the mobile information handling system was turned off. In another example, BMU 191 may set the variable that stores the previous amount of time that the mobile information handling system was turned off to the amount of time that the mobile information handling system was turned off. In one or more embodiments, the method may proceed to 510.

At 530, a variable that stores a starting capacity may be set to a current cell capacity when the mobile information handling system was turned off. In one example, BMC 130 may set a variable that stores a starting capacity to a current cell capacity when IHS 110 was turned off. For instance, BMC 130 may set a variable that stores a starting capacity to a current cell capacity when the mobile information handling system on/off event was "off". In another example, BMU 191 may set a variable that stores a starting capacity to a current cell capacity. For instance, BMU 191 may set a variable that stores a starting capacity to a current cell capacity when the mobile information handling system on/off event was "off".

At 532, a variable that stores an ending capacity utilized may be set to a current cell capacity when the mobile information handling system was turned on. In one example, BMC 130 may set a variable that stores an ending capacity utilized to a current cell capacity when IHS 110 was turned on. For instance, BMC 130 may set a variable that stores an ending capacity utilized to a current cell capacity when the mobile information handling system on/off event was "on". In another example, BMU 191 may set a variable that stores an ending capacity utilized to a current cell capacity when IHS 110 was turned on. For instance, BMU 191 may set a variable that stores an ending capacity utilized to a current cell capacity when the mobile information handling system on/off event was "on".

At 534, a variable that stores an amount of capacity utilized may be set to a difference between the variable that stores the starting cell capacity and the variable that stores the ending capacity. In one example, BMC 130 may set a variable that stores an amount of capacity utilized to a difference between the variable that stores the starting cell capacity and the variable that stores the ending capacity. In another example, BMU 191 may set a variable that stores an amount of capacity utilized to a difference between the variable that stores the starting cell capacity and the variable that stores the ending capacity.

At 536, a capacity utilization rate may be determined. In one example, BMC 130 may determine a capacity utilization rate. In another example, BMU 191 may determine a capacity utilization rate. In one or more embodiments, determining the capacity utilization rate may include setting the capacity utilization rate to a quotient of a value of the variable that stores the amount of capacity utilized and a value of the variable associated with the current day that stores the amount of time that the mobile information handling system was turned off. For example, determining the capacity utilization rate may include setting the capacity utilization rate to a quotient of a value of the variable that stores the amount of capacity utilized and Max_Time_Off [current day], where the array index "current day" is the current day of the week.

At 538, an element of an array associated with reserve capacities may be set to a sum of a safety margin value (SMV) and a product of an element of an array associated with maximum amounts of times off and the capacity utilization rate. For example, the element of the array associated with maximum amounts of times off may be associated with the current day of the week. For instance, an array 550 associated with reserve rechargeable battery capacities may store the sum of the SMV and the product of an element of array 540 associated with the current day of the week and the capacity utilization rate (e.g., "Capacity_Utilization_Rate"). As one example, BMC 130 may store the sum of the safety margin value and the product of an element of array 540 associated with the current day of the week and the capacity utilization rate via an element of array 550 associated with the current day of the week. As another example, BMU 191 may store the sum of the safety margin value and the product of an element of array 540 associated with the current day of the week and the capacity utilization rate via an element of array 550 associated with the current day of the week. In one or more embodiments, a first safety margin value may be utilized for days of a typical workweek, and a second safety margin value may be utilized for days of a typical weekend. For example, the second safety margin value may be greater than the first safety margin value. For instance, the second safety margin value may be greater than the first safety margin value since IHS 110 may not be coupled to an external power supply as often on days of a typical weekend as IHS 110 may be coupled to a external power supply during days of a typical workweek.

Figure 6A:
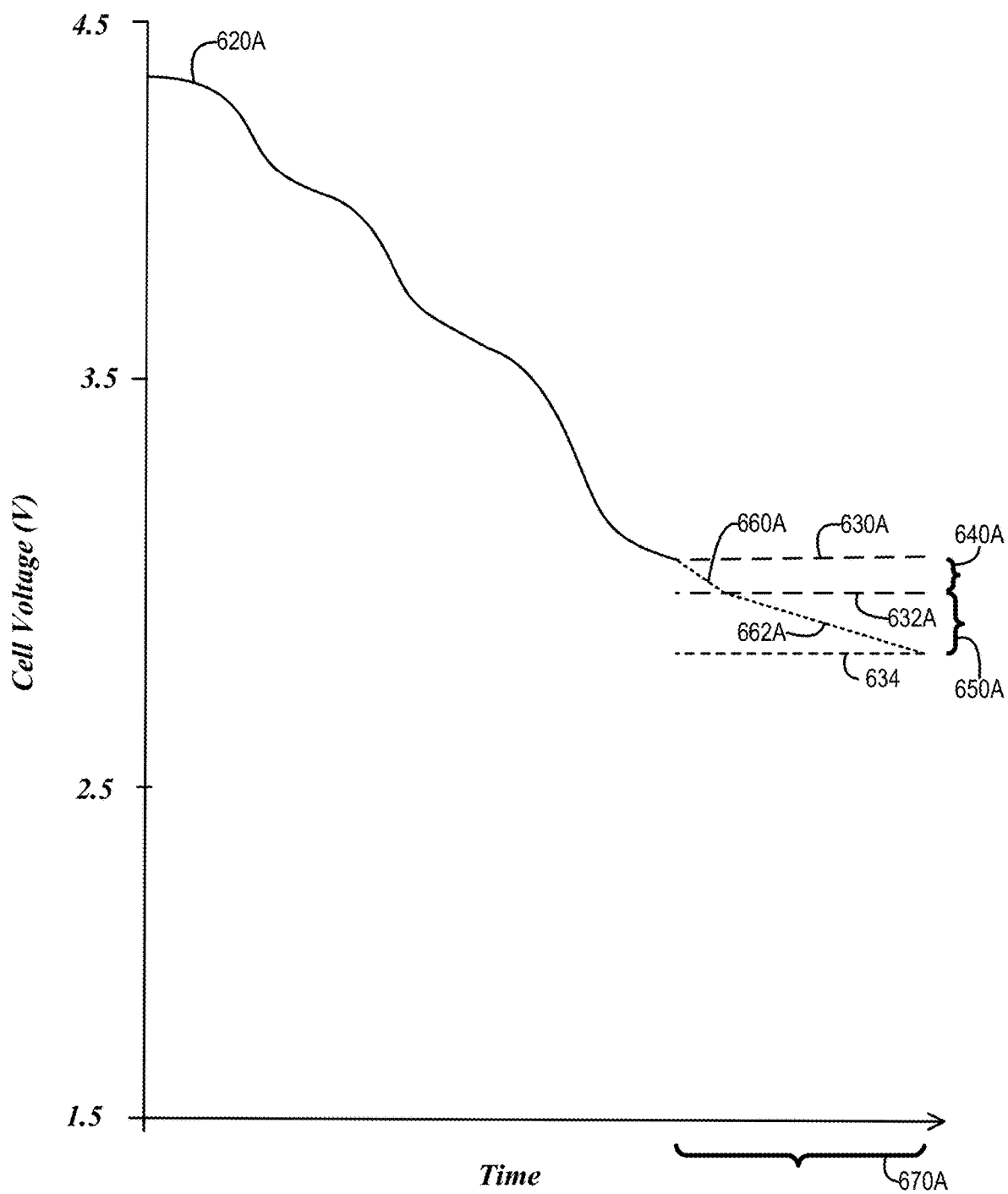
FIG. 6A illustrates an example of a plot of voltage of a cell of a rechargeable battery versus time, according to one or more embodiments.

Turning now to FIG. 6A, an example of a plot of voltage of a cell of a rechargeable battery versus time is illustrated, according to one or more embodiments. As shown, a plot 620A of voltage values of a cell of rechargeable battery 190 may decrease as time increases. In one or more embodiments, data for plot 620A may be collected during a period of time of a typical workweek, where a user of IHS 110 may coupled IHS 110 to an external power supply, which may recharge one or more cells of rechargeable battery 190 and/or may provide power to components IHS 110. For example, a typical workweek may include Monday through Friday. Although an example "typical workweek" is described as Monday through Friday other time periods may be utilized, according to one or more embodiments.

In one or more embodiments, a voltage value of a cell may be determined. For example, if the voltage value of the cell is at or falls below a threshold voltage value 630A, IHS 110 may be transitioned to a power conservation state to prevent the cell from damaging rechargeable battery 190 and/or to prevent the cell from being damaged. For instance, threshold voltage value 630A may be a "critical low" voltage value. In one or more embodiments, an amount of capacity of rechargeable battery 190 may be consumed while IHS 110 transitions to the power conservation state. For example, the power conservation state may be an ACPI power state of G3, among others. In one or more embodiments, capacity of rechargeable battery 190 may be associated with a voltage of a cell of rechargeable battery 190. For example, threshold voltage value 630A may be associated with a threshold capacity value of rechargeable battery 190.

In one or more embodiments, threshold voltage value 630A may be based at least on a capacity of rechargeable battery 190 utilized to store data from volatile memory medium 150 to non-volatile memory medium 160 and a capacity safety margin. In one example, the capacity of rechargeable battery 190 utilized to store the data from volatile memory medium 150 to non-volatile memory medium 160 may be associated with a voltage range 640A. In another example, voltage range 640A may be from a voltage value 632A to threshold voltage value 630A. For instance, voltage range 640A may be associated with a capacity of rechargeable battery 190 utilized to store the data from volatile memory medium 150 to non-volatile memory medium 160. As an example, voltage range 640A may be associated with a capacity of rechargeable battery 190 utilized to store the data from volatile memory medium 150 as a hibernation file to non-volatile memory medium 160.

In one or more embodiments, the capacity safety margin may be associated with a voltage range 650A. For example, voltage range 650A may be from a voltage value 634 to voltage value 632A. For instance, voltage value 634 may be a RTC voltage threshold value. As an example, if a cell voltage value of rechargeable battery 190 falls below the RTC voltage threshold value (i.e., voltage value 634), RTC 132 may not function (e.g., not time information) or may not function properly (e.g., providing incorrect time information), which may be worse than not functioning at all. As another example, if a cell voltage value of rechargeable battery 190 falls below the RTC voltage threshold value (i.e., voltage value 634), RTC 132 may not be able to keep track of time and/or may lose track of time, among others.

In one or more embodiments, voltage range 640A may be determined based at least on a voltage utilization rate 660A. For example, voltage utilization rate 660A may be associated with an amount of storage of memory medium 150. For instance, the more the amount of storage of memory medium 150, the more time to store data of storage of memory medium 150 to non-volatile memory medium 160. In one or more embodiments, voltage range 650A may be determined based at least on a voltage utilization rate 662A. For example, voltage utilization rate 662A may be "Capacity_Utilization_Rate" as illustrated in array 550 in FIG. 5B. For instance, voltage utilization rate 662A may be determined via method element 536 of FIG. 5B. In one or more embodiments, voltage range 650A may be determined based at least on Reserved_Capacity["Day of the week"] in array 550 in FIG. 5B, where "Day of the week" is the day that the cell of rechargeable battery 190 is being unutilized to provide power to IHS 110.

In one or more embodiments, "Capacity_Utilization_Rate", as illustrated in array 550 in FIG. 5B, may be based at least on one or more of a temperature value associated with a cell of rechargeable battery 190, a number of charge cycles associated with the cell of rechargeable battery 190, and a type of cell (e.g., a grade of cell), among others. In one example, capacity of the cell of rechargeable battery 190 may vary based at least on the temperature value associated with the cell of rechargeable battery 190, as illustrated in FIG. 4A. In a second example, capacity of the cell of rechargeable battery 190 may vary based at least on the number of charge cycles associated with the cell of rechargeable battery 190, as shown in FIG. 4B. In another example, capacity of the cell of rechargeable battery 190 may vary based at least on the type of cell associated with the cell of rechargeable battery 190, as illustrated in FIG. 4B. In one or more embodiments, threshold voltage value 630A may be based at least on a sum of voltage value 634, voltage range 640A, and voltage range 650A. In one or more embodiments, voltage range 640A and voltage range 650A may permit IHS 110 to transition from an operational state to a power conservation state within an amount of time 670A. For example, the operational state may include any power utilization state of IHS 110, and the power conservation state may include a mechanical off state of IHS 110 or an effective mechanical off state of IHS 110. For instance, the operational state may include any of ACPI states G0, G1, and G2, and the power conservation state may include an ACPI state G3.

Figure 6B:
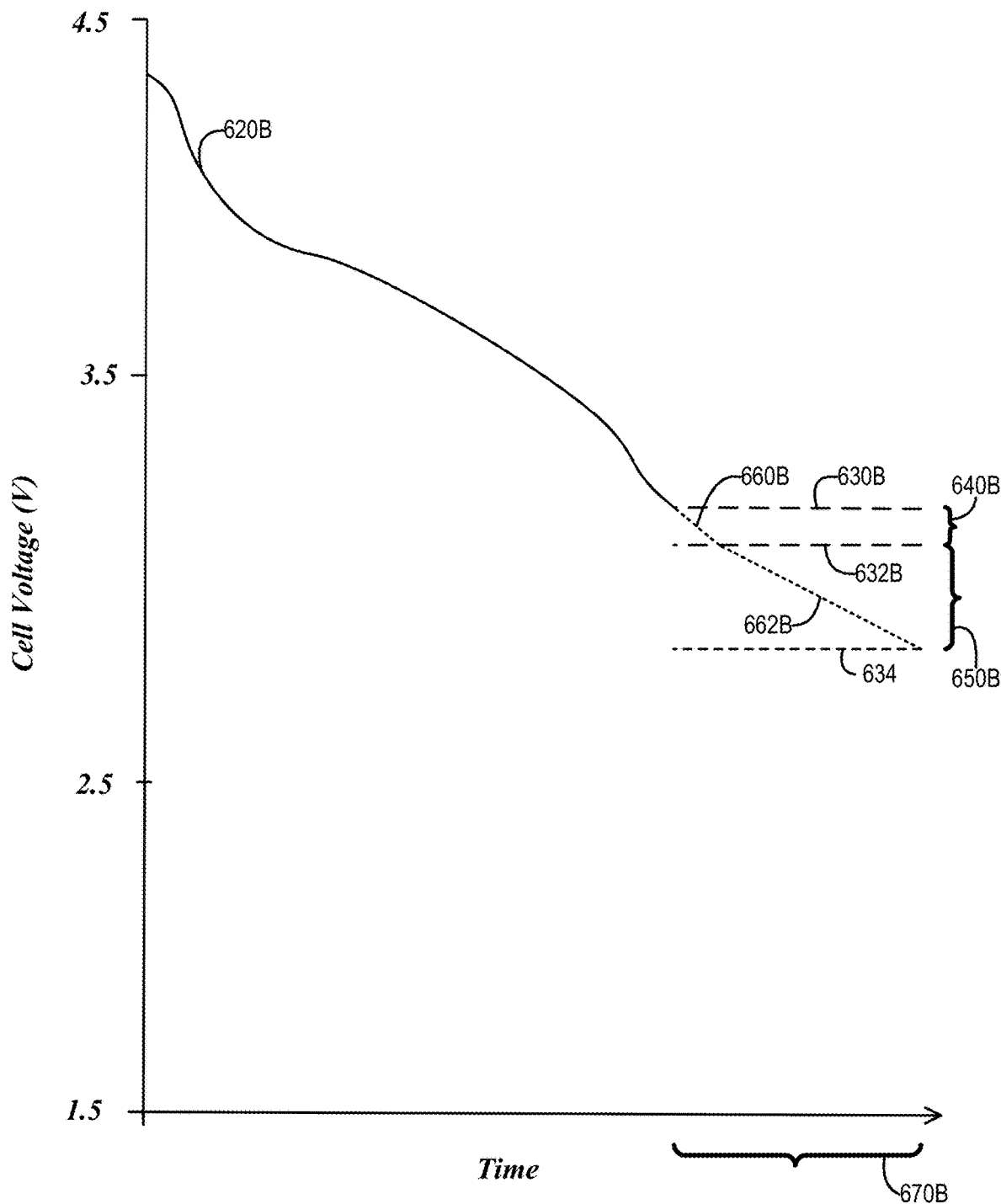
FIG. 6B illustrates another example of a plot of voltage of a cell of a rechargeable battery versus time, according to one or more embodiments.

Turning now to FIG. 6B, another example of a plot of voltage of a cell of a rechargeable battery versus time is illustrated, according to one or more embodiments. As shown, a plot 620B of voltage values of a cell of rechargeable battery 190 may decrease as time increases. In one or more embodiments, data for plot 620B may be collected during a period of time of a typical weekend, where a user of IHS 110 may not couple IHS 110 to an external power supply. For instance, the user of IHS 110 may leave IHS 110 in a shoulder bag, a brief case, a purse, a computer bag, etc. during a typical weekend. For instance, a typical weekend may include Saturday and Sunday. Although an example "typical weekend" is described as Saturday and Sunday other time periods may be utilized, according to one or more embodiments.

In one or more embodiments, a voltage value of a cell may be determined. For example, if the voltage value of the cell is at or falls below a threshold voltage value 630B, IHS 110 may be transitioned to a power conservation state to prevent the cell from damaging rechargeable battery 190 and/or to prevent the cell from being damaged. For instance, threshold voltage value 630B may be a "critical low" voltage value. In one or more embodiments, an amount of capacity of rechargeable battery 190 may be consumed while IHS 110 transitions to the power conservation state. For example, the power conservation state may be an ACPI power state of G3, among others. In one or more embodiments, capacity of rechargeable battery 190 may be associated with a voltage of a cell of rechargeable battery 190. For example, threshold voltage value 630B may be associated with a threshold capacity value of rechargeable battery 190.

In one or more embodiments, threshold voltage value 630B may be based at least on a capacity of rechargeable battery 190 utilized to store data from volatile memory medium 150 to non-volatile memory medium 160 and a capacity safety margin. In one example, the capacity of rechargeable battery 190 utilized to store the data from volatile memory medium 150 to non-volatile memory medium 160 may be associated with a voltage range 640B. For example, voltage range 640B may be from a voltage value 632B to threshold voltage value 630B. For instance, voltage range 640B may be associated with a capacity of rechargeable battery 190 utilized to store the data from volatile memory medium 150 to non-volatile memory medium 160. As an example, voltage range 640B may be associated with a capacity of rechargeable battery 190 utilized to store the data from volatile memory medium 150 as a hibernation file to non-volatile memory medium 160.

In one or more embodiments, the capacity safety margin may be associated with a voltage range 650B. For example, voltage range 650B may be from voltage value 634 to voltage value 632B. In one or more embodiments, voltage range 640B may be determined based at least on a voltage utilization rate 660B. For example, voltage utilization rate 660B may be associated with an amount of storage of memory medium 150. For instance, the more the amount of storage of memory medium 150, the more time to store data of storage of memory medium 150 to non-volatile memory medium 160. In one or more embodiments, voltage range 650B may be determined based at least on a voltage utilization rate 662B. For example, voltage utilization rate 662B may be "Capacity_Utilization_Rate" as illustrated in array 550 in FIG. 5B. For instance, voltage utilization rate 662B may be determined via method element 536 of FIG. 5B. In one or more embodiments, voltage range 650B may be determined based at least on Reserved_Capacity["Day of the week"] in array 550 in FIG. 5B, where "Day of the week" is the day that the cell of rechargeable battery 190 is being unutilized to provide power to IHS 110.

In one or more embodiments, "Capacity_Utilization_Rate", as illustrated in array 550 in FIG. 5B, may be based at least on one or more of a temperature value associated with a cell of rechargeable battery 190, a number of charge cycles associated with the cell of rechargeable battery 190, and a type of cell (e.g., a grade of cell), among others. In one example, capacity of the cell of rechargeable battery 190 may vary based at least on the temperature value associated with the cell of rechargeable battery 190, as illustrated in FIG. 4A. In a second example, capacity of the cell of rechargeable battery 190 may vary based at least on the number of charge cycles associated with the cell of rechargeable battery 190, as shown in FIG. 4B. In another example, capacity of the cell of rechargeable battery 190 may vary based at least on the type of cell associated with the cell of rechargeable battery 190, as illustrated in FIG. 4B. In one or more embodiments, threshold voltage value 630B may be based at least on a sum of voltage value 634, voltage range 640B, and voltage range 650B. In one or more embodiments, voltage range 640B and voltage range 650B may permit IHS 110 to transition from an operational state to a power conservation state within an amount of time 670B. For example, the operational state may include any power utilization state of IHS 110, and the power conservation state may include a mechanical off state of IHS 110 or an effective mechanical off state of IHS 110. For instance, the operational state may include any of ACPI states G0, G1, and G2, and the power conservation state may include an ACPI state G3.

Figure 7:
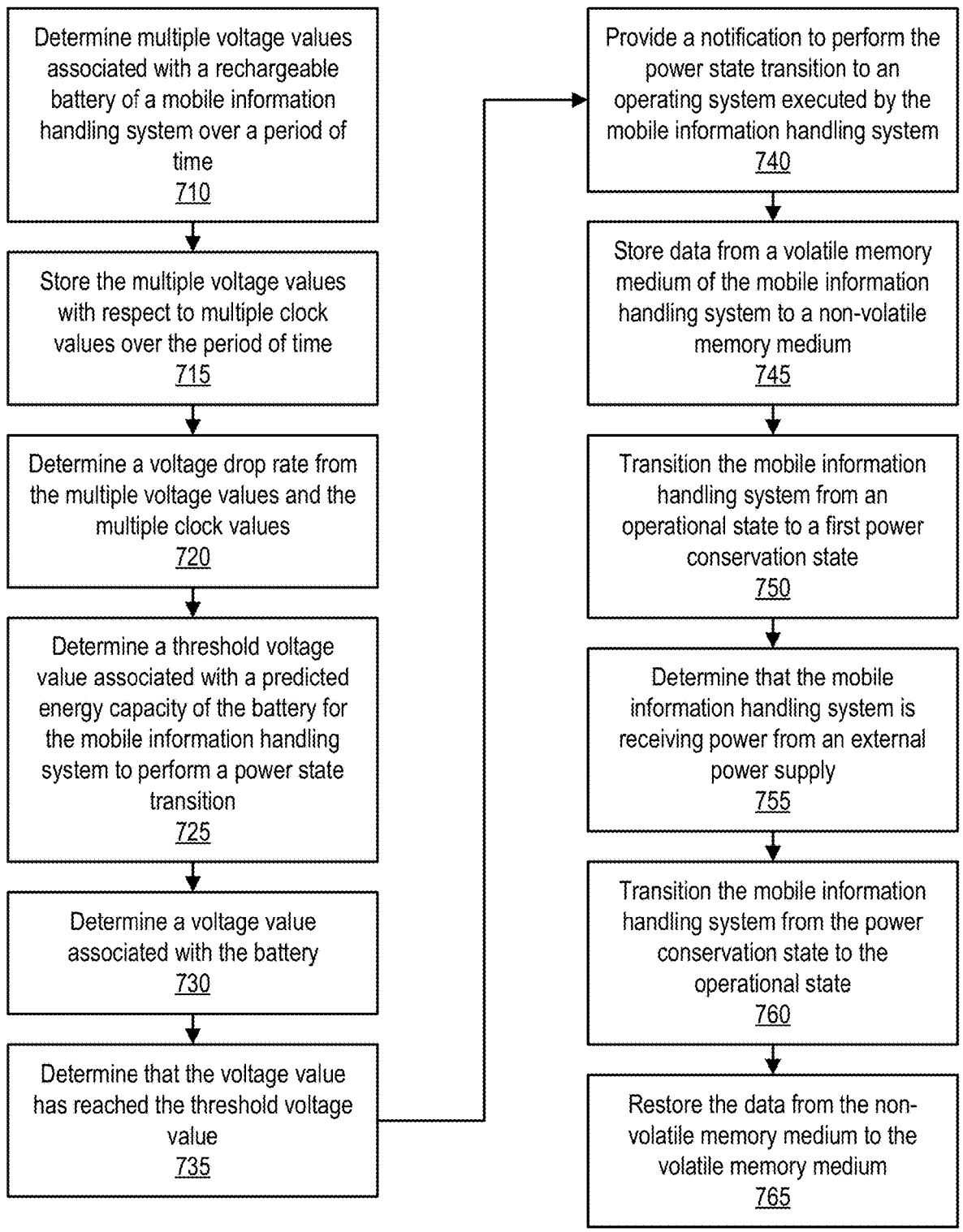
FIG. 7 illustrates another example of operating a mobile information handling system, according to one or more embodiments.

Turning now to FIG. 7, another example of operating a mobile information handling system is illustrated, according to one or more embodiments. At 710, multiple voltage values associated with a rechargeable battery of a mobile information handling system may be determined over a period of time. In one example, BMC 130 may determine multiple voltage values associated with rechargeable battery 190 of IHS 110 over a period of time. In another example, BMU 191 may determine multiple voltage values associated with rechargeable battery 190 of IHS 110 over a period of time.

At 715, the multiple voltage values may be stored with respect to multiple clock values over the period of time. In one example, BMC 130 may store the multiple voltage values with respect to multiple clock values over the period of time. In another example, BMU 191 may store the multiple voltage values with respect to multiple clock values over the period of time. In one or more embodiments, the multiple clock values may be determined via a real time clock. For example, the multiple clock values may be determined via RTC 132. For instance, each clock value of the multiple clock values may include time information. At 720, a voltage drop rate may be determined from the multiple voltage values and the multiple clock values. In one example, BMC 130 may determine a voltage drop rate from the multiple voltage values and the multiple clock values. In another example, BMU 191 may determine a voltage drop rate from the multiple voltage values and the multiple clock values.

In one or more embodiments, a temperature value associated with the rechargeable battery may be determined. In one example, BMC 130 may determine a temperature value associated with rechargeable battery 190. In another example, BMU 191 may determine a temperature value associated with rechargeable battery 190. In one or more embodiments, determining the temperature value associated with the rechargeable battery may include determining a temperature value associated with a cell of the rechargeable battery. In one or more embodiments, determining the voltage drop rate may be based at least on the temperature value associated with the rechargeable battery. In one or more embodiments, a number of charge cycles associated with the rechargeable battery may be determined. In one example, BMC 130 may determine a number of charge cycles associated with rechargeable battery 190. In another example, BMU 191 may determine a number of charge cycles associated with rechargeable battery 190. In one or more embodiments, determining the voltage drop rate may be based at least on the number of charge cycles associated with the rechargeable battery. In one or more embodiments, the number of charge cycles associated with rechargeable battery 190 may be stored via BMC 139 and/or BMU 191, among others. For example, determining the number of charge cycles associated with rechargeable battery 190 may include retrieving the stored number of charge cycles associated with rechargeable battery 190.

At 725, a threshold voltage value associated with a predicted energy capacity of the rechargeable battery for the mobile information handling system to perform a power state transition may be determined. In one example, BMC 130 may determine a threshold voltage value associated with a predicted energy capacity of rechargeable battery 190 for IHS 110 to perform a power state transition. In another example, BMU 191 may determine a threshold voltage value associated with a predicted energy capacity of rechargeable battery 190 for IHS 110 to perform a power state transition.

In one or more embodiments, the predicted energy capacity of the rechargeable battery for the mobile information handling system to perform the power state transition may be based at least on a sum of a first voltage range and a second voltage range. In one example, the first voltage range (e.g., voltage range 640) may be associated with an energy capacity of rechargeable battery 190 for IHS 110 to store data from volatile memory medium 150 to non-volatile memory medium 160. For instance, the first voltage range (e.g., voltage range 640) may be associated with an energy capacity of rechargeable battery 190 for IHS 110 to store the data from volatile memory medium 150 as a hibernation file to non-volatile memory medium 160. In another example, the second voltage range (e.g., voltage range 650) may be associated with a reserve capacity to perform the power state transition. For instance, the reserve capacity may be based at least on a voltage utilization rate 662. As an example, the reserve capacity may be a safety margin. For instance, the safety margin may be associated with a safety margin value.

In one or more embodiments, the threshold voltage value may be a voltage value 630. For example, voltage value 630 may include a sum of voltage range 640 and voltage range 650. For instance, voltage value 630 may include sum of voltage range 640, voltage range 650, and a RTC voltage threshold value (e.g., voltage value 634), which may be a minimum voltage where RTC 132 may function properly. In one or more embodiments, voltage range 650 may be determined from the voltage drop rate from the multiple voltage values and the multiple clock values. For example, a voltage utilization rate 662 may be determined based at least on the voltage drop rate. For instance, a voltage utilization rate 662 may be determined from the voltage drop rate.

At 730, a voltage value associated with the rechargeable battery may be determined. In one example, BMC 130 may determine a voltage value associated with rechargeable battery 190. In another example, BMU 191 may determine a voltage value associated with rechargeable battery 190. At 735, it may be determined that the voltage value has reached the threshold voltage value. In one example, BMC 130 may determine that the voltage value has reached the threshold voltage value. In another example, BMU 191 may determine that the voltage value has reached the threshold voltage value.

At 740, a notification to perform the power state transition may be provided to an operating system executed by the mobile information handling system. In one example, BMC 130 may provide a notification to perform the power state transition to OS 162 executed by the IHS 110. In another example, BMU 191 may provide a notification to perform the power state transition to OS 162 executed by the IHS 110. For instance, BMU 191 may provide a notification to perform the power state transition to OS 162 executed by the IHS 110 via BMC 130. As an example, BMU 191 may provide a notification to perform the power state transition to BMC 130, which may provide the notification to OS 162. In one or more embodiments, IHS 110 executing OS 162 may include processor 120 executing OS 162.

At 745, data from a volatile memory medium of the mobile information handling system may be stored to a non-volatile memory medium. For example, OS 162 may store data from volatile memory medium 150 to non-volatile memory medium 160. For instance, OS 162 may store the data from volatile memory medium 150 to a file that is stored via non-volatile memory medium 160. As an example, OS 162 may store the data from volatile memory medium 150 to a hibernation file that is stored via non-volatile memory medium 160. In one instance, OS 162 may store the data from volatile memory medium 150 and a state of processor 120 to a hibernation file that is stored via non-volatile memory medium 160. In another instance, OS 162 may store the data from volatile memory medium 150 to a compressed hibernation file that is stored via non-volatile memory medium 160.

At 750, the mobile information handling system may be transitioned from an operational state to a power conservation state. For example, OS 162 may transition IHS 110 from an operational state to a power conservation state. For instance, the power conservation state may be an ACPI power state of G1, an ACPI power state of G2, or an ACPI power state of G3, among others. In one or more embodiments, method elements 745 and 750 may be performed in response to the notification. For example, OS 162 may perform method elements 745 and 750 in response to receiving the notification. At 755, it may be determined that the mobile information handling system is receiving power from an external power supply. In one example, BMC 130 may determine that IHS 110 is receiving power from external power supply 192. In a second example, BMU 191 may determine that IHS 110 is receiving power from external power supply 192. In another example, OS 162 may determine that IHS 110 is receiving power from external power supply 192. In one or more embodiments, determining that IHS 110 is receiving power from external power supply 192 may include determining that IHS 110 is receiving power from receptacle 195, which may provide AC power.

At 760, the mobile information handling system may be transitioned from the power conservation state to the operational state. For example, OS 162 may transition IHS 110 from the power conservation state to the operational state.

For instance, the operational state may be an ACPI power state of G0. In one or more embodiments, transitioning IHS 110 from the power conservation state to the operational state may include booting OS 162. At 765, the data from the non-volatile memory medium may be restored to the volatile memory medium. For example, OS 162 may restore the data from non-volatile memory medium 160 to volatile memory medium 150. For instance, OS 162 may restore the data to volatile memory medium 150 from the file that was stored via non-volatile memory medium 160. As an example, OS 162 may restore the data to volatile memory medium 150 from the hibernation file that was stored via non-volatile memory medium 160. In one instance, OS 162 may restore the state of processor 120 from the hibernation file that was stored via non-volatile memory medium 160. In another instance, OS 162 may restore the data to volatile memory medium 150 from the compressed hibernation file that was stored via non-volatile memory medium 160. In one or more embodiments, method elements 760 and 765 may be performed in response to determining that the mobile information handling system is receiving power from the external power supply. For example, OS 162 may perform method elements 760 and 765 in response to determining that IHS 110 is receiving power from the external power supply (e.g., external power supply 192).

In one or more embodiments, one or more of the method and/or process elements and/or one or more portions of a method and/or a process element may be performed in varying orders, may be repeated, or may be omitted. Furthermore, additional, supplementary, and/or duplicated method and/or process elements may be implemented, instantiated, and/or performed as desired, according to one or more embodiments. Moreover, one or more of system elements may be omitted and/or additional system elements may be added as desired, according to one or more embodiments.

In one or more embodiments, a memory medium may be and/or may include an article of manufacture. For example, the article of manufacture may include and/or may be a software product and/or a program product. For instance, the memory medium may be coded and/or encoded with processor-executable instructions in accordance with at least a portion of one or more flowcharts, at least a portion of one or more systems, at least a portion of one or more methods, and/or at least a portion of one or more processes described herein to produce the article of manufacture.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An mobile information handling system, comprising:
   an embedded controller;
   a battery management unit communicatively coupled to the embedded controller;
   at least one processor;
   a volatile memory medium communicatively coupled to the at least one processor;
   a non-volatile memory medium communicatively coupled to the at least one processor; and
   a rechargeable battery configured to provide power to the embedded controller, the battery management unit, the at least one processor, the volatile memory medium, and the non-volatile memory medium;
   wherein the battery management unit is configured to:
      determine a plurality of voltage values associated with the rechargeable battery over a period of time;
      store the plurality of voltage values with respect to a plurality of clock values over the period of time;
      determine a voltage drop rate from the plurality of voltage values and the plurality of clock values;
      determine a threshold voltage value associated with a predicted energy capacity of the rechargeable battery for the mobile information handling system to perform a power state transition;
      determine a voltage value associated with the rechargeable battery; and
      determine that the voltage value has reached the threshold voltage value;
   wherein the embedded controller is configured to:
      provide a notification to perform the power state transition to an operating system executed by the at least one processor; and
   wherein the at least one processor is configured to, in response to the notification:
      store data from the volatile memory medium to the non-volatile memory medium; and
      transition the mobile information handling system from an operational state to a power conservation state.

2. The mobile information handling system of claim 1, further comprising:
   a real time clock;
   wherein the rechargeable battery is further configured to provide power to the real time clock; and
   wherein the battery management unit is further configured to determine the plurality of clock values via the real time clock.

3. The mobile information handling system of claim 1,
   wherein the battery management unit is further configured to determine a temperature value associated with the rechargeable battery; and
   wherein, to determine the voltage drop rate, the battery management unit is further configured to determine the voltage drop rate based at least on the temperature value associated with the rechargeable battery.

4. The mobile information handling system of claim 1,
   wherein the battery management unit is further configured to determine a number of charge cycles associated with the rechargeable battery; and
   wherein, to determine the voltage drop rate, the battery management unit is further configured to determine the voltage drop rate based at least on the number of charge cycles associated with the rechargeable battery.

5. The mobile information handling system of claim 1, wherein the at least one processor is further configured to:
   determine that the mobile information handling system is receiving power from an external power supply; and
   in response to determining that the mobile information handling system is receiving power from the external power supply:
      transition the mobile information handling system from the power conservation state to the operational state; and
      restore the data from the non-volatile memory medium to the volatile memory medium.

6. The mobile information handling system of claim 1, wherein the rechargeable battery includes the battery management unit.

7. The mobile information handling system of claim 1, wherein, to store the data from the volatile memory medium to the non-volatile memory medium, the at least one processor is further configured to store the data as a file that is stored via the non-volatile memory medium.

8. A method, comprising:
- determining a plurality of voltage values associated with a rechargeable battery of a mobile information handling system over a period of time;
- storing the plurality of voltage values with respect to a plurality of clock values over the period of time;
- determining a voltage drop rate from the plurality of voltage values and the plurality of clock values;
- determining a threshold voltage value associated with a predicted energy capacity of the rechargeable battery for the mobile information handling system to perform a power state transition;
- determining a voltage value associated with the rechargeable battery;
- determining that the voltage value has reached the threshold voltage value;
- providing, by an embedded controller, a notification to perform the power state transition to an operating system executed by the mobile information handling system; and
- in response to the notification:
  - storing, by the operating system, data from a volatile memory medium of the mobile information handling system to a non-volatile memory medium; and
  - transitioning, by the operating system, the mobile information handling system from an operational state to a power conservation state.

9. The method of claim 8, further comprising: determining the plurality of clock values via a real time clock.

10. The method of claim 8, further comprising:
- determining a temperature value associated with the rechargeable battery;
- wherein the determining the voltage drop rate is based at least on the temperature value associated with the rechargeable battery.

11. The method of claim 8, further comprising:
- determining a number of charge cycles associated with the rechargeable battery;
- wherein the determining the voltage drop rate is based at least on the number of charge cycles associated with the rechargeable battery.

12. The method of claim 8, further comprising:
- determining that the mobile information handling system is receiving power from an external power supply; and
- in response to the determining that the mobile information handling system is receiving power from the external power supply:
  - transitioning, by the operating system, the mobile information handling system from the power conservation state to the operational state; and
  - restoring, by the operating system, the data from the non-volatile memory medium to the volatile memory medium.

13. The method of claim 8,
- wherein the rechargeable battery includes a battery management unit;
- wherein the determining the voltage drop rate from the plurality of voltage values and the plurality of clock values includes determining, by the battery management unit, the voltage drop rate from the plurality of voltage values and the plurality of clock values.

14. The method of claim 8, wherein the storing the data from the volatile memory medium to the non-volatile memory medium includes storing the data as a file that is stored via the non-volatile memory medium.

15. A battery management unit, configured to:
- determine a plurality of voltage values associated with a rechargeable battery of a mobile information handling system over a period of time;
- store the plurality of voltage values with respect to a plurality of clock values over the period of time;
- determine a voltage drop rate from the plurality of voltage values and the plurality of clock values;
- determine a threshold voltage value associated with a predicted energy capacity of the rechargeable battery for the mobile information handling system to perform a power state transition;
- determine a voltage value associated with the rechargeable battery;
- determine that the voltage value has reached the threshold voltage value; and
- provide a notification to transition the mobile information handling system from an operational state to a power conservation state.

16. The battery management unit of claim 15, wherein the battery management unit is further configured to determine the plurality of clock values via a real time clock of the mobile information handling system.

17. The battery management unit of claim 15,
- wherein the battery management unit is further configured to determine a temperature value associated with the rechargeable battery; and
- wherein, to determine the voltage drop rate, the battery management unit is further configured to determine the voltage drop rate based at least on the temperature value associated with the rechargeable battery.

18. The battery management unit of claim 15,
- wherein the battery management unit is further configured to determine a number of charge cycles associated with the rechargeable battery; and
- wherein, to determine the voltage drop rate, the battery management unit is further configured to determine the voltage drop rate based at least on the number of charge cycles associated with the rechargeable battery.

19. The battery management unit of claim 15, wherein, to provide the notification to transition the mobile information handling system from the operational state to the power conservation state, the battery management unit is further configured to provide the notification to an embedded controller of the mobile information handling system.

20. The battery management unit of claim 15, wherein the battery management unit includes a microcontroller.

* * * * *